United States Patent
Nosaka

(10) Patent No.: US 10,972,073 B2
(45) Date of Patent: Apr. 6, 2021

(54) MULTIPLEXER, HIGH-FREQUENCY FRONT END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/824,773

(22) Filed: Mar. 20, 2020

(65) Prior Publication Data

US 2020/0220523 A1 Jul. 9, 2020

Related U.S. Application Data

(60) Division of application No. 16/217,254, filed on Dec. 12, 2018, now Pat. No. 10,637,439, which is a (Continued)

(30) Foreign Application Priority Data

Jun. 14, 2016 (JP) .............................. JP2016-118399

(51) Int. Cl.
  *H04B 1/38* (2015.01)
  *H03H 9/72* (2006.01)
  (Continued)

(52) U.S. Cl.
  CPC .................. *H03H 9/72* (2013.01); *H03F 3/19* (2013.01); *H03H 9/0009* (2013.01);
  (Continued)

(58) Field of Classification Search
  CPC ............ H03H 9/72; H03H 9/725; H03H 9/64; H03H 9/6489; H03H 9/6483;
  (Continued)

(56) References Cited

U.S. PATENT DOCUMENTS

2002/0163400 A1* 11/2002 Toncich .................. H01P 1/213
  333/125
2003/0111931 A1* 6/2003 Suzuki ................. H03H 9/6483
  310/313 D
(Continued)

FOREIGN PATENT DOCUMENTS

JP  S63-260213 A  10/1988
JP  H057124 A  1/1993
(Continued)

OTHER PUBLICATIONS

International Search Report for International Application No. PCT/JP2017/019261, dated Aug. 15, 2017.
(Continued)

*Primary Examiner* — Tuan Pham

(74) *Attorney, Agent, or Firm* — Pearne & Gordon LLP

(57) ABSTRACT

A multiplexer (1) includes a plurality of filters connected to a common terminal (110). The multiplexer (1) includes: a low-frequency filter (11L) that is formed of at least one surface acoustic wave resonator arranged between the common terminal (110) and the input/output terminal (120) and has a first pass band; a high-frequency filter (12H) that is connected between the common terminal (110) and the input/output terminal (130) and has a second pass band located at a higher frequency than the first pass band; and a capacitor ($C_{B1}$) that is serially arranged in a connection path between the common terminal (110) and the low-frequency filter (11L). The Q value of the capacitor ($C_{B1}$) in the second pass band is higher than the Q value in the second pass band of a capacitance obtained by treating the at least one surface acoustic wave resonator of the low-frequency filter (11L) as a capacitance.

10 Claims, 15 Drawing Sheets

Related U.S. Application Data continuation of application No. PCT/JP2017/019261, filed on May 23, 2017.

(51) Int. Cl.

| | |
|---|---|
| *H03H 9/64* | (2006.01) |
| *H03H 9/05* | (2006.01) |
| *H03H 9/145* | (2006.01) |
| *H03H 9/25* | (2006.01) |
| *H03F 3/19* | (2006.01) |
| *H03H 9/00* | (2006.01) |
| *H03H 9/02* | (2006.01) |
| *H04B 1/40* | (2015.01) |

(52) U.S. Cl.
CPC .... *H03H 9/02559* (2013.01); *H03H 9/02866* (2013.01); *H03H 9/059* (2013.01); *H03H 9/0542* (2013.01); *H03H 9/0557* (2013.01); *H03H 9/0561* (2013.01); *H03H 9/0576* (2013.01); *H03H 9/145* (2013.01); *H03H 9/25* (2013.01); *H03H 9/6436* (2013.01); *H03H 9/6483* (2013.01); *H03H 9/6489* (2013.01); *H03H 9/725* (2013.01); *H04B 1/40* (2013.01); *H03F 2200/111* (2013.01); *H03F 2200/294* (2013.01); *H03F 2200/451* (2013.01)

(58) Field of Classification Search
CPC ...... H03H 9/0566; H03H 9/0576; H04B 1/40; H03F 2200/111; H03F 2200/294; H03F 2200/451
See application file for complete search history.

(56) References Cited

U.S. PATENT DOCUMENTS

| | | | |
|---|---|---|---|
| 2004/0227586 A1* | 11/2004 | Taniguchi ............ | H03H 9/6483 333/133 |
| 2006/0181366 A1 | 8/2006 | Taniguchi | |
| 2009/0298433 A1 | 12/2009 | Sorrells et al. | |
| 2010/0194494 A1 | 8/2010 | Inoue et al. | |
| 2011/0095845 A1 | 4/2011 | Fujiwara et al. | |
| 2013/0109433 A1 | 5/2013 | Wang et al. | |
| 2013/0300519 A1 | 11/2013 | Tamasaki et al. | |
| 2014/0167877 A1 | 6/2014 | Shimizu et al. | |
| 2015/0295697 A1 | 10/2015 | Kawachi et al. | |
| 2016/0149556 A1 | 5/2016 | Kando | |
| 2016/0294361 A1 | 10/2016 | Yamane et al. | |
| 2016/0301385 A1 | 10/2016 | Okuda | |
| 2017/0134005 A1 | 5/2017 | Takeuchi et al. | |
| 2017/0187352 A1 | 6/2017 | Omura | |

FOREIGN PATENT DOCUMENTS

| | | |
|---|---|---|
| JP | H0522074 A | 1/1993 |
| JP | 2003-283363 A | 10/2003 |
| JP | 2004-140696 A | 5/2004 |
| JP | 2004-140738 A | 5/2004 |
| JP | 2005-45432 A | 2/2005 |
| JP | 2005-72805 A | 3/2005 |
| JP | 2012-080160 A | 4/2012 |
| JP | 2012-175315 A | 9/2012 |
| JP | 5768951 B1 | 8/2015 |
| JP | 2015-201808 A | 11/2015 |
| JP | 2016-54515 A | 4/2016 |
| KR | 10-2014-0128054 A | 11/2014 |
| WO | 2005/088835 A1 | 9/2005 |
| WO | 2009/147787 A1 | 12/2009 |
| WO | 2012/098816 A1 | 7/2012 |
| WO | 2015/025651 A1 | 2/2015 |
| WO | 2015/098756 A1 | 7/2015 |
| WO | 2016/013659 A1 | 1/2016 |
| WO | 2016/052129 A1 | 4/2016 |

OTHER PUBLICATIONS

Written Opinion for International Application No. PCT/JP2017/019261, dated Aug. 15, 2017.
Notice of Rejection for Japanese Patent Application No. 2018-523615, dated Sep. 3, 2019.
Notification of Preliminary Rejection for Korean Patent Application No. 10-2018-7035919, dated Oct. 29, 2019.
Notice of Reasons for Rejection for Japanese Patent Application No. 2018-523615, dated Nov. 26, 2019.
Japanese Decision of Rejection for Japanese Patent Application No. 2018-523615, dated Mar. 3, 2020.
Trial Decision for JP Patent Application No. 2018-523615 dated Feb. 24, 2021.

* cited by examiner

| Q VALUE OF EQUIVALENT CAPACITANCE COMPONENT | \|Γ\|(℧) | | IL (dB) | |
|---|---|---|---|---|
| | 2110 MHz | 2170 MHz | 2110 MHz | 2170 MHz |
| 1000 | 0.999 | 0.999 | 1.209 | 1.409 |
| 500 | 0.998 | 0.998 | 1.219 | 1.418 |
| 200 | 0.996 | 0.995 | 1.247 | 1.445 |
| 100 | 0.992 | 0.992 | 1.293 | 1.489 |
| 50 | 0.984 | 0.984 | 1.381 | 1.572 |
| 20 | 0.961 | 0.961 | 1.614 | 1.798 |
| 10 | 0.923 | 0.925 | 1.939 | 2.119 |
| 5 | 0.855 | 0.857 | 2.457 | 2.638 |
| 2 | 0.706 | 0.711 | 3.551 | 3.752 |
| 1 | 0.619 | 0.626 | 4.777 | 5.007 |

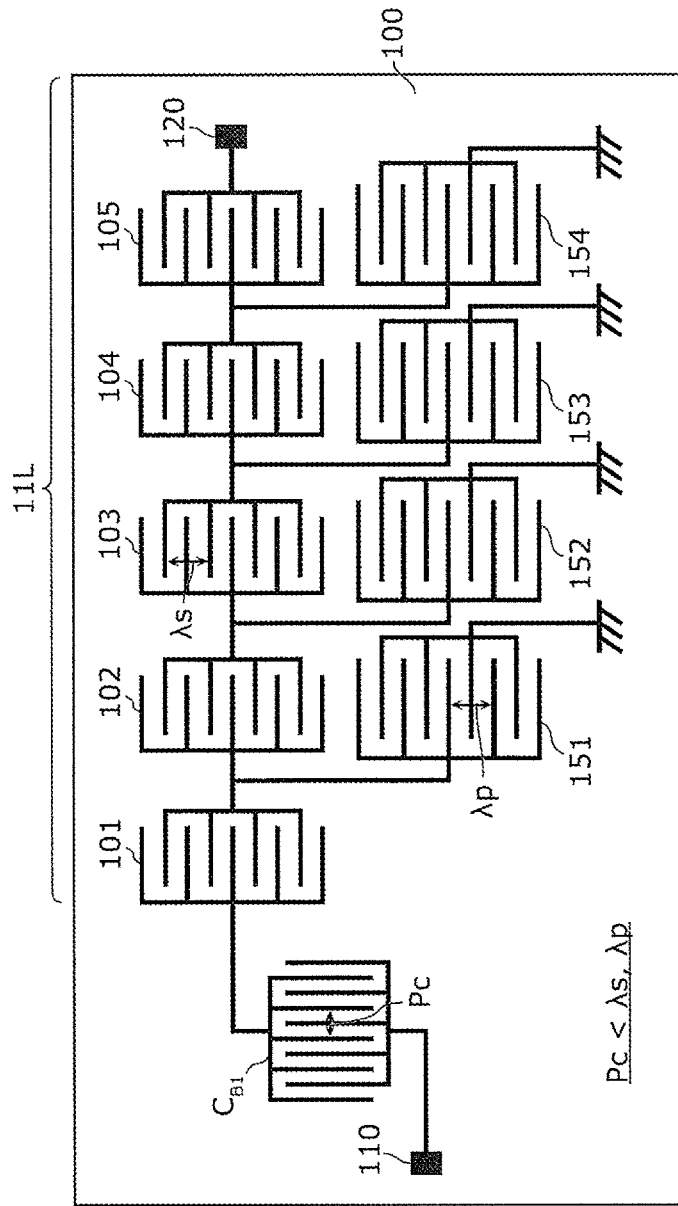

$f0_{15L} < f0_{16H}$ $f0_{17L} < f0_{18H}$

MULTIPLEXER, HIGH-FREQUENCY FRONT END CIRCUIT, AND COMMUNICATION DEVICE

This is a division of U.S. patent application Ser. No. 16/217,254 filed on Dec. 12, 2018, which is a continuation of International Application No. PCT/JP2017/019261 filed on May 23, 2017 which claims priority from Japanese Patent Application No. 2016-118399 filed on Jun. 14, 2016. The contents of these applications are incorporated herein by reference in their entireties.

BACKGROUND OF THE DISCLOSURE

Field of the Disclosure

The present disclosure relates to a multiplexer that includes surface acoustic wave filters, to a high-frequency front end circuit, and to a communication device.

Description of the Related Art

For recent cellular phones, there has been a demand for a plurality of frequency bands and a plurality of wireless systems, so-called multiple bands and multiple modes, to be supported by a single cellular phone terminal. In order to realize this demand, a multiplexer that splits a high-frequency signal having a plurality of wireless carrier frequencies is arranged immediately below a single antenna. Surface acoustic wave filters having low loss inside the pass band thereof and a steep bandpass characteristic around the periphery of the pass band are used as the plurality of band pass filters constituting such a multiplexer.

Patent Document 1 discloses a surface acoustic wave filter device having a configuration in which a plurality of surface acoustic wave filters are connected to each other.

FIG. 10 is a circuit configuration diagram of a surface acoustic wave filter device 501 disclosed in Patent Document 1. Specifically, a transmission filter 520 and a reception filter 513, which are formed of surface acoustic wave resonators, are commonly connected to an antenna terminal 510, and an impedance-matching shunt inductor L is connected to the antenna terminal 510. The transmission filter 520 is, for example, a UMTS Band 3 transmission filter (transmission band: 1710-1785 MHz) and the reception filter 513 is, for example, a UMTS Band 3 reception filter (reception band: 1805-1880 MHz).

Patent Document 1: Japanese Unexamined Patent Application Publication No. 2012-175315

BRIEF SUMMARY OF THE DISCLOSURE

However, in the case where the transmission filter 520 and the reception filter 513 are commonly connected to the antenna terminal 510 as in the surface acoustic wave filter device 501 disclosed in Patent Document 1 and in the case where a plurality of transmission filters and a plurality of reception filters are commonly connected to an antenna terminal in order to support multiple bands, the filter characteristic of one filter is greatly affected by the filter characteristic of another filter. For example, in the case where the return loss seen from the antenna terminal side of the other filter is increased in the pass band of the one filter, the insertion loss in the pass band of the one filter is increased by the reflection characteristic of the other filter. If a demultiplexing/multiplexing device, a phase adjusting circuit, or the like is arranged in a stage prior to the filters as a countermeasure, the multiplexer is undesirably increased in size and cost.

Accordingly, the present disclosure was made in order to solve the above-described problem, and it is an object thereof to provide a multiplexer, a high-frequency front end circuit, and a communication device in which the propagation loss of a high-frequency signal is reduced without arranging a demultiplexing/multiplexing device, a phase-adjusting circuit, or the like in a stage prior to the filters, and that are compact and low cost.

In order to achieve this object, a multiplexer according to an aspect of the present disclosure has a common terminal, a first input/output terminal, and a second input/output terminal, and includes a plurality of filters connected to the common terminal. The multiplexer includes: a first filter that is formed of at least one surface acoustic wave resonator arranged between the common terminal and the first input/output terminal, and has a first pass band; a second filter that is connected between the common terminal and the second input/output terminal and has a second pass band located at a higher frequency than the first pass band; and a capacitor that is serially arranged on a connection path between the common terminal and the first filter. A Q value of the capacitor in the second pass band is higher than a Q value in the second pass band of a capacitance obtained when treating the at least one surface acoustic wave resonator as a capacitance.

It is known that the loss due to bulk waves is generated on the high-frequency side of an anti-resonant point in a SAW resonator that utilizes leaky waves using a lithium tantalate ($LiTaO_3$) substrate or Love waves using a lithium niobate ($LiNbO_3$) substrate. In other words, in a high-frequency filter formed of such a surface acoustic wave resonator, the loss due to bulk waves is generated in an attenuation band on the high-frequency side of the center frequency. This loss due to bulk waves substantially does not affect the attenuation of the high-frequency filter, but the reflection coefficient ($|\Gamma|$) of the high-frequency filter is reduced. On the other hand, a high-frequency filter formed of a surface acoustic wave resonator has a capacitive characteristic and functions as a capacitor, and therefore functions as a capacitor having a low Q value in the frequency band in which the bulk waves are generated. Therefore, in the case of a multiplexer having a plurality of filters connected to a common terminal, the bulk wave loss of a first filter having a low pass band (first pass band) causes the insertion loss inside the pass band of a second filter having a pass band (second pass band) that contains the frequency at which the bulk wave loss is generated to increase.

In contrast, according to the above-described configuration, a capacitor having a Q value that is higher than a capacitance Q value, in the second pass band, of the at least one surface acoustic wave resonator constituting the first filter is inserted between the first filter and the common terminal. Therefore, the capacitance Q value in the second pass band can be increased on the common terminal side of the first filter. As a result, the reflection coefficient ($|\Gamma|$) of the first filter in the second pass band can be increased (return loss can be reduced), and therefore the insertion loss in the second pass band of the second filter, which is connected to the common terminal along with the first filter, can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

In addition, a multiplexer according to an aspect of the present disclosure has a common terminal, a first input/output terminal, a second input/output terminal, and includes a plurality of filters connected to the common terminal. The multiplexer includes: a first filter that is formed of at least one surface acoustic wave resonator arranged between the common terminal and the first input/output terminal, and has a first pass band; a second filter that is connected between the common terminal and the second input/output terminal, and has a second pass band located at a higher frequency than the first pass band; and a capacitor that is serially arranged on a connection path between the common terminal and the first filter and is for compensating for bulk wave radiation loss of the at least one surface acoustic wave resonator in the second pass band.

According to this configuration, a capacitor for compensating for the bulk wave radiation, in the second pass band, of the at least one surface acoustic wave resonator constituting the first filter is inserted between the first filter and the common terminal. As a result, the reflection coefficient ($|\Gamma|$) of the first filter in the second pass band can be increased (return loss can be reduced), and therefore the insertion loss in the second pass band of the second filter can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

In addition, the first filter may have a substrate having a piezoelectric property in at least part thereof and on which an interdigital transducer (IDT) electrode constituting the at least one surface acoustic wave resonator is formed, the capacitor may be formed on the substrate using comb-shaped electrodes that face each other, and a pitch of a plurality of electrode fingers constituting the comb-shaped electrodes of the capacitor may be smaller than a pitch of a plurality of electrode fingers constituting the IDT electrode.

According to this configuration, the frequency of the bulk wave radiation generated by the capacitor is shifted so as to be further toward the high-frequency side than the frequency of the bulk wave radiation generated by the IDT electrode, and therefore the Q value of the capacitor in the second pass band can be set so as to be higher than the capacitance Q value of the at least one surface acoustic wave resonator in the second pass band. Therefore, the capacitance Q value in the second pass band can be increased on the common terminal side of the first filter. As a result, the reflection coefficient ($|\Gamma|$) of the first filter in the second pass band can be increased (return loss can be reduced), and therefore the insertion loss in the second pass band of the second filter can be improved.

In addition, the capacitor may be formed in a plurality of layers inside a multilayer substrate on which the first filter and the second filter are mounted and in which a wiring line that connects the first filter and the second filter to each other is formed.

According to this configuration, in contrast to the case where the IDT electrode of the at least one surface acoustic wave resonator is formed on one surface of the substrate, the capacitor has a multilayer structure, and therefore the Q value of the capacitor in the second pass band can be set so as to be higher than the capacitance Q value of the at least one surface acoustic wave resonator in the second pass band. Therefore, the capacitance Q value in the second pass band can be increased on the common terminal side of the first filter. As a result, the reflection coefficient ($|\Gamma|$) of the first filter in the second pass band can be increased (return loss can be reduced), and therefore the insertion loss in the second pass band of the second filter can be improved.

In addition, in the at least one surface acoustic wave resonator of the first filter, leaky waves that propagate along a piezoelectric substrate composed of $LiTaO_3$ may be utilized as surface acoustic waves.

In a surface acoustic wave resonator in which leaky waves are utilized using a piezoelectric substrate composed of $LiTaO_3$, the loss due to bulk waves is generated on the high-frequency side of the anti-resonant point.

According to this configuration, the reflection coefficient ($|\Gamma|$) of the first filter in the second pass band can be increased (return loss can be reduced), and therefore the insertion loss in the second pass band of the second filter can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

In addition, in the at least one surface acoustic wave resonator of the first filter, Love waves that propagate along a piezoelectric substrate composed of $LiNbO_3$ may be utilized as surface acoustic waves.

In a surface acoustic wave resonator in which Love waves are utilized using a piezoelectric substrate composed of $LiNbO_3$, the loss due to bulk waves is generated on the high-frequency side of the anti-resonant point.

According to this configuration, the reflection coefficient ($|\Gamma|$) of the first filter in the second pass band can be increased (return loss can be reduced), and therefore the insertion loss in the second pass band of the second filter can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

The multiplexer may further include: a third input/output terminal; and a third filter that is formed of at least one surface acoustic wave resonator arranged between the common terminal and the third input/output terminal, and has a third pass band located at a lower frequency than the second pass band. In the at least one surface acoustic wave resonator of the third filter, Rayleigh waves that propagate along a piezoelectric substrate composed of $LiNbO_3$ may be utilized as surface acoustic waves, and a capacitor does not have to be serially arranged on a connection path between the common terminal and the third filter.

In a surface acoustic wave resonator utilizing Rayleigh waves using a piezoelectric substrate composed of $LiNbO_3$, the frequency at which bulk wave radiation is generated on the high-frequency side of the anti-resonant point lies in a frequency band located at a frequency at least twice the frequency of the anti-resonant point and is sufficiently higher than the pass band of a filter used in a cellular phone multiplexer, and there is substantially no effect from the bulk wave radiation on other filters.

According to this configuration, the reflection coefficient ($|\Gamma|$) of the third filter in the second pass band is not reduced by the bulk wave radiation. Therefore, the propagation loss of a high-frequency signal can be reduced without arranging a capacitor in a stage prior to the third filter and the reductions in size and cost can be realized.

The multiplexer may further include an inductor that is connected between the common terminal and the ground terminal.

Thus, impedance matching can be secured between the antenna element and each filter.

In addition, a high-frequency front end circuit according to an aspect of the present disclosure includes: any one of the multiplexers described above; and an amplification circuit that is connected to the multiplexer.

According to this configuration, a high-frequency front end circuit can be provided in which the propagation loss of a high-frequency signal can be reduced without arranging a demultiplexing/multiplexing device, a phase adjusting circuit, or the like in a stage prior to the filters, and in which the reductions in size and cost can be realized.

In addition, a communication device according to an aspect of the present disclosure includes: an RF signal processing circuit that processes a high-frequency signal transmitted or received by an antenna element; and the above-described high-frequency front end circuit that transmits the high-frequency signal between the antenna element and the RF signal processing circuit.

According to this configuration, the propagation loss of a high-frequency signal can be reduced without arranging a demultiplexing/multiplexing device, a phase adjusting circuit, or the like in a stage prior to the filters, and the reductions in size and cost can be realized.

With a multiplexer, a high-frequency front end circuit, or a communication device according to the present disclosure, the propagation loss of a high-frequency signal can be reduced without arranging a demultiplexing/multiplexing device, a phase adjusting circuit, or the like in a stage prior to the filters, and the reductions in size and cost can be realized.

BRIEF DESCRIPTION OF THE SEVERAL VIEWS OF THE DRAWINGS

FIG. 6A is a plan view illustrating a first example of the electrode layout of a low-frequency filter and a capacitor according to embodiment 1.

DETAILED DESCRIPTION OF THE DISCLOSURE

Figure 1A:
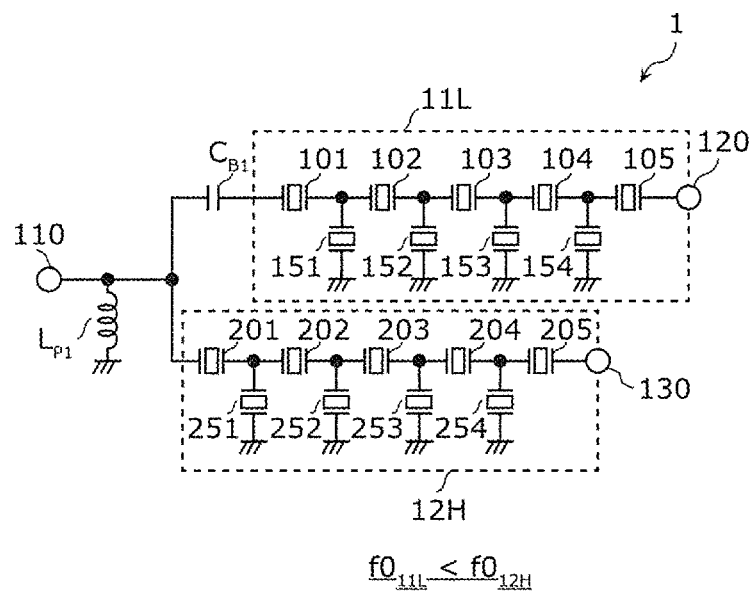
FIG. 1A is a circuit configuration diagram of a multiplexer according to embodiment 1.

Hereafter, embodiments of the present disclosure will be described in detail using the drawings. The embodiments described hereafter each illustrate a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure. Constituent elements not described in the independent claims among constituent elements in the following embodiments are described as arbitrary constituent elements. In addition, the sizes or size ratios between the constituent elements illustrated in the drawings are not necessarily strictly accurate.

Embodiment 1

[1.1 Circuit Configuration of Multiplexer]

FIG. 1A is a circuit configuration diagram of a multiplexer 1 according to embodiment 1. As illustrated in the figure, the multiplexer 1 includes a low-frequency filter 11L, a high-frequency filter 12H, a capacitor $C_{B1}$, an inductor $L_{P1}$, a common terminal 110, and input/output terminals 120 and 130. The multiplexer 1 is a composite elastic wave filter device that includes the low-frequency filter 11L and the high-frequency filter 12H, which are connected to the common terminal 110.

For example, the common terminal 110 can be connected to an antenna element, and the input/output terminals 120 and 130 can be connected to a high-frequency signal processing circuit via an amplification circuit.

The low-frequency filter 11L is a first filter that is arranged between the common terminal 110 and the input/output terminal 120 (first input/output terminal), and has a first pass band (center frequency $f0_{11L}$). The low-frequency filter 11L is configured as a ladder band pass filter, and includes series arm resonators 101, 102, 103, 104, and 105, which are connected in a series arm connected between the common terminal 110 and the input/output terminal 120, and parallel arm resonators 151, 152, 153, and 154, which are connected in parallel arms connected between the series arm and ground terminals. The series arm resonators 101 to 105 and the parallel arm resonators 151 to 154 are surface acoustic wave (SAW) resonators. The SAW resonators of the low-frequency filter 11L utilize leaky waves using a lithium tantalate ($LiTaO_3$) substrate or Love waves using a lithium niobate ($LiNbO_3$) substrate.

In this embodiment, an example is illustrated in which the low-frequency filter 11L is used as a long term evolution (LTE) standard Band 11 reception filter (reception pass band: 1475.9-1495.9 MHz).

The high-frequency filter 12H is a second filter that is arranged between the common terminal 110 and the input/output terminal 130 (second input/output terminal) and has a second pass band (center frequency $f0_{12H}$ (>$f0_{11L}$)) located at a higher frequency than the first pass band. The high-frequency filter 12H is configured as a ladder band pass filter, and includes series arm resonators 201, 202, 203, 204, and 205, which are connected in a series arm connected between the common terminal 110 and the input/output terminal 130, and parallel arm resonators 251, 252, 253, and 254, which are connected in parallel arms connected between the series arm and ground terminals. In addition, the resonator that is connected closest to the common terminal 110 among the series arm resonators 201 to 205 and the parallel arm resonators 251 to 254 is the series arm resonator 201.

In this embodiment, the series arm resonators 201 to 205 and the parallel arm resonators 251 to 254 are all SAW resonators, but these resonators may instead be elastic wave resonators that utilize boundary acoustic waves or bulk acoustic waves (BAW). In addition, the high-frequency filter 12H does not need to have a ladder structure, and additionally may have a configuration that does not include elastic wave resonators such as an LC resonance circuit.

In this embodiment, an example is illustrated in which the high-frequency filter 12H is used as an LTE standard Band 1 reception filter (reception pass band: 2110-2170 MHz).

The capacitor $C_{B1}$ is serially arranged on a path (series arm) that connects the common terminal 110 and the series arm resonator 101 to each other. Here, the Q value of the capacitor $C_{B1}$ in the second pass band is higher than a capacitance Q value, in the second pass band, of a capacitance component of the SAW resonators of the low-frequency filter 11L. In other words, the capacitor $C_{B1}$ has a function of compensating for bulk wave radiation loss of the SAW resonators of the low-frequency filter 11L in the second pass band. The capacitor $C_{B1}$ is a principle feature of the multiplexer 1 according to embodiment 1, and therefore the capacitor $C_{B1}$ will be described in detail using FIG. 2 and the figures thereafter.

The inductor $L_{P1}$ is connected between the common terminal 110 and a ground terminal. In this way, impedance matching can be secured between the antenna element and each filter.

Figure 1B:
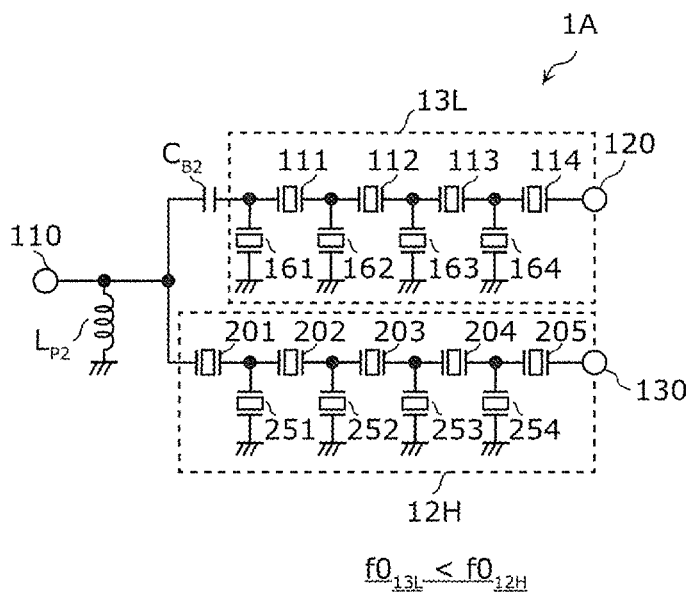
FIG. 1B is a circuit configuration diagram of a multiplexer according to modification 1 of embodiment 1.

FIG. 1B is a circuit configuration diagram of a multiplexer 1A according to modification 1 of embodiment 1. The multiplexer 1A according to this modification differs from the multiplexer 1 according to embodiment 1 only in terms of the circuit configuration of the low-frequency filter. Hereafter, the description of the parts of the configuration of the multiplexer 1A according to this modification that are the same as in the configuration of the multiplexer 1 according to embodiment 1 will be omitted and the description will focus on the parts of the configuration that are different.

As illustrated in FIG. 1B, the multiplexer 1A includes a low-frequency filter 13L, a high-frequency filter 12H, a capacitor $C_{B2}$, an inductor $L_{P2}$, a common terminal 110, and input/output terminals 120 and 130. The multiplexer 1A is a composite elastic wave filter device that includes the low-frequency filter 13L and the high-frequency filter 12H, which are connected to the common terminal 110.

The low-frequency filter 13L is a first filter that is arranged between the common terminal 110 and the input/output terminal 120 (first input/output terminal) and has a first pass band (center frequency $f0_{13L}$). The low-frequency filter 13L is configured as a ladder band pass filter, and includes series arm resonators 111, 112, 113, and 114, which are connected in a series arm connected between the common terminal 110 and the input/output terminal 120, and parallel arm resonators 161, 162, 163, and 164, which are connected in parallel arms connected between the series arm and ground terminals. The series arm resonators 111 to 114 and the parallel arm resonators 161 to 164 are SAW resonators. The SAW resonators of the low-frequency filter 13L utilize leaky waves using a $LiTaO_3$ substrate or Love waves using a $LiNbO_3$ substrate. The low-frequency filter 13L differs from the low-frequency filter 11L according to embodiment 1 in that the parallel arm resonator 161 is arranged closest to the common terminal 110 and in that there are four series arm resonators.

The capacitor $C_{B2}$ is serially arranged on a path (series arm) that connects the common terminal 110 and the parallel arm resonator 161 to each other. Here, the Q value of the capacitor $C_{B2}$ in the second pass band is higher than the capacitance Q value, in the second pass band, of a capacitance component of the SAW resonators of the low-frequency filter 13L. In other words, the capacitor $C_{B2}$ has a function of compensating for bulk wave radiation loss of the SAW resonators of the low-frequency filter 13L in the second pass band.

The inductor $L_{P2}$ is connected between the common terminal 110 and a ground terminal. In this way, impedance matching can be secured between the antenna element and each filter.

In other words, in a multiplexer according to the present disclosure, the resonator of the low-frequency filter that is arranged in the stage subsequent to the capacitors $C_{B1}$ and $C_{B2}$ and is connected closest to the common terminal may be either a series arm resonator or a parallel arm resonator.

Next, the configuration of a multiplexer according to a comparative example will be described and problematic points of the multiplexer according to the comparative example will be described.

1.2 Multiplexer According to Comparative Example

Figure 2:
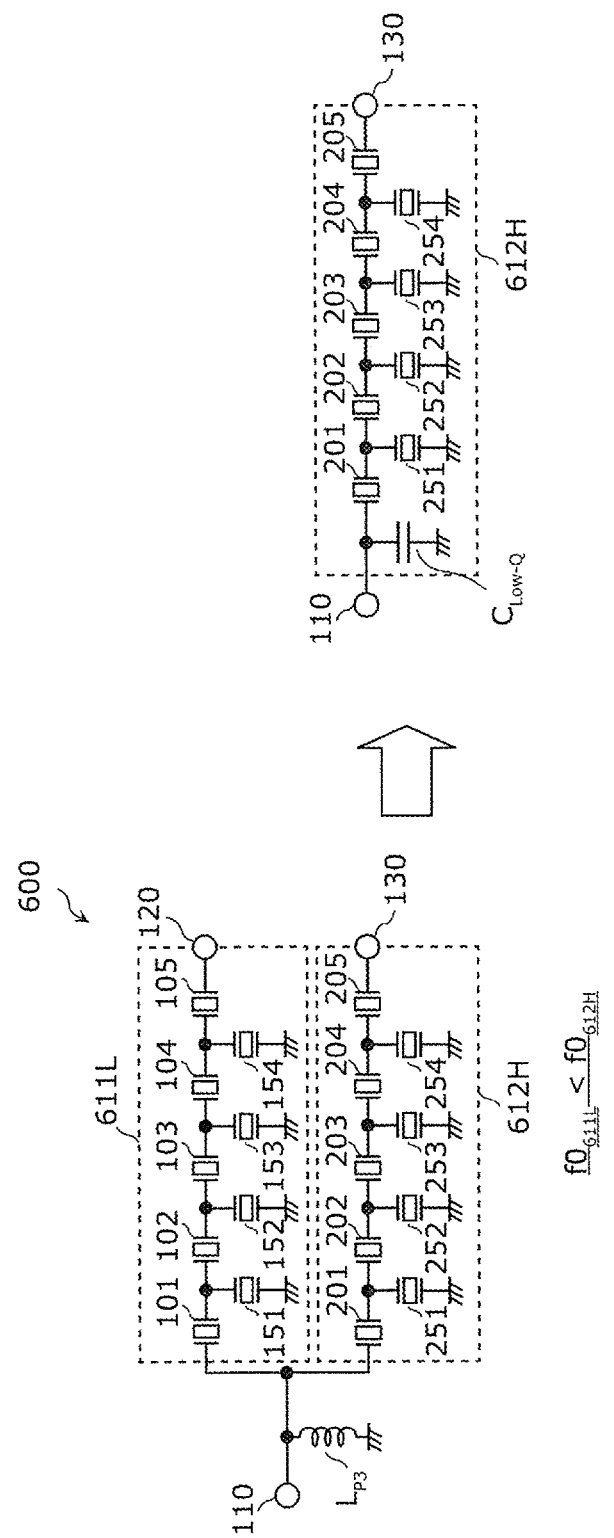
FIG. 2 is a circuit configuration diagram of a multiplexer according to a comparative example.

FIG. 2 is a circuit configuration diagram of a multiplexer 600 according to a comparative example. As illustrated in the figure, the multiplexer 600 according to the comparative example includes a low-frequency filter 611L, a high-frequency filter 612H, an inductor $L_{P3}$, a common terminal 110, and input/output terminals 120 and 130. The multiplexer 600 is a composite elastic wave filter device that includes the low-frequency filter 611L and the high-frequency filter 612H, which are connected to the common terminal 110. The circuit configuration of the multiplexer 600 according to the comparative example differs from that of the multiplexer 1 according to embodiment 1 in that the capacitor $C_{B1}$ is not arranged.

The low-frequency filter 611L is a filter that is arranged between the common terminal 110 and the input/output terminal 120 and has a first pass band (center frequency $f0_{611L}$). The resonator configuration of the low-frequency filter 611L is the same as that of the low-frequency filter 11L.

The high-frequency filter 612H is a filter that is arranged between the common terminal 110 and the input/output terminal 130 and has a second pass band (center frequency $f0_{612H}$ ($>f0_{611L}$)) located at a higher frequency than the first pass band. The resonator configuration of the high-frequency filter 12H is the same as that of the high-frequency filter 12H.

Loss due to bulk waves is generated on the high-frequency side of an anti-resonant point in a SAW resonator that utilizes leaky waves using a $LiTaO_3$ substrate or Love waves using a $LiNbO_3$ substrate.

Figure 3A:
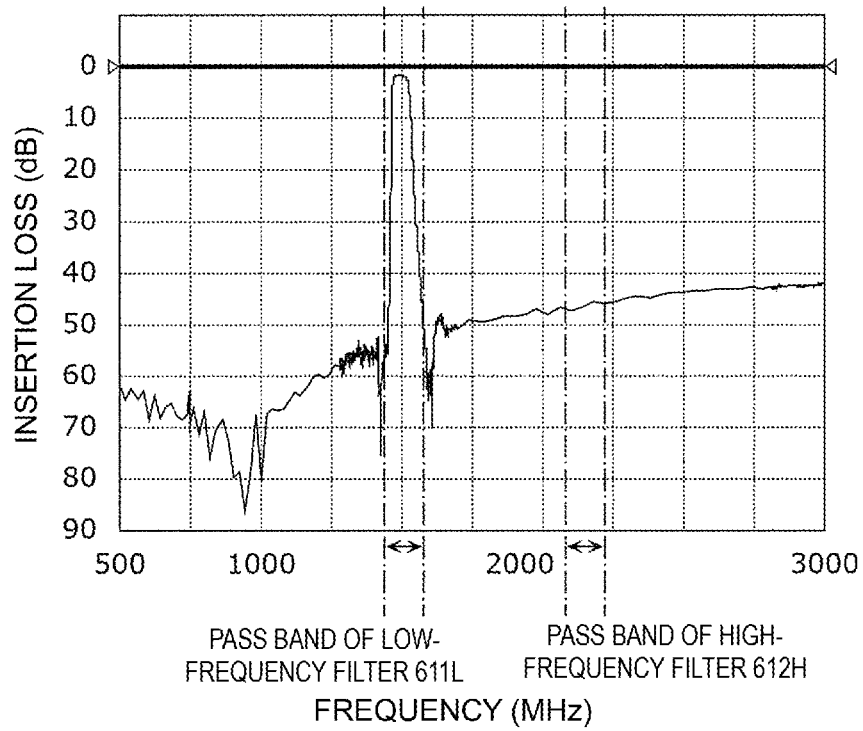
FIG. 3A is a graph illustrating a wide bandpass characteristic of a low-frequency filter.
Figure 3B:
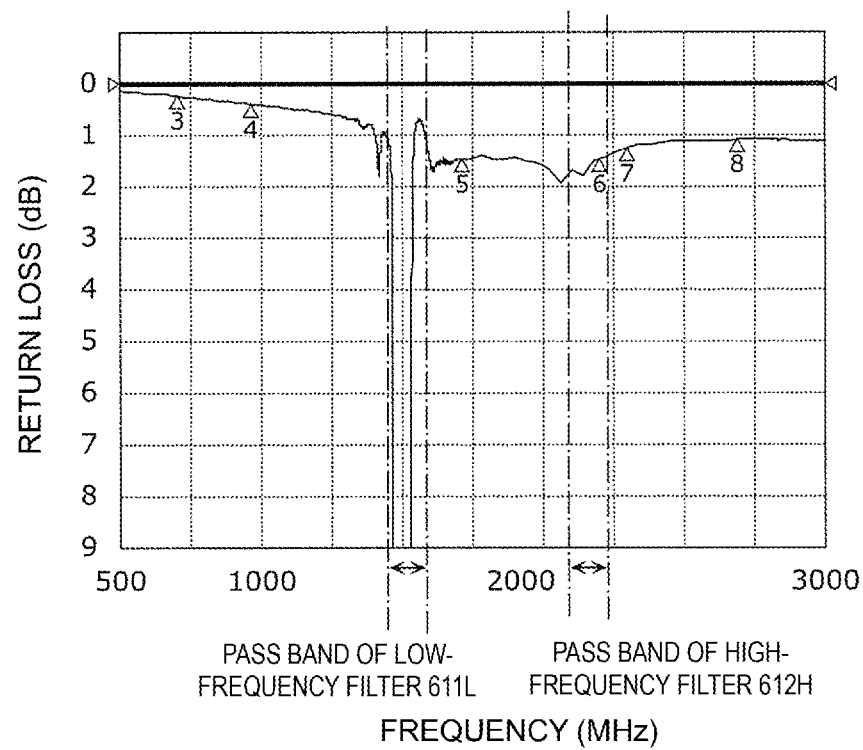
FIG. 3B illustrates a graph depicting a wide reflection characteristic of the low-frequency filter.
Figure 3C:
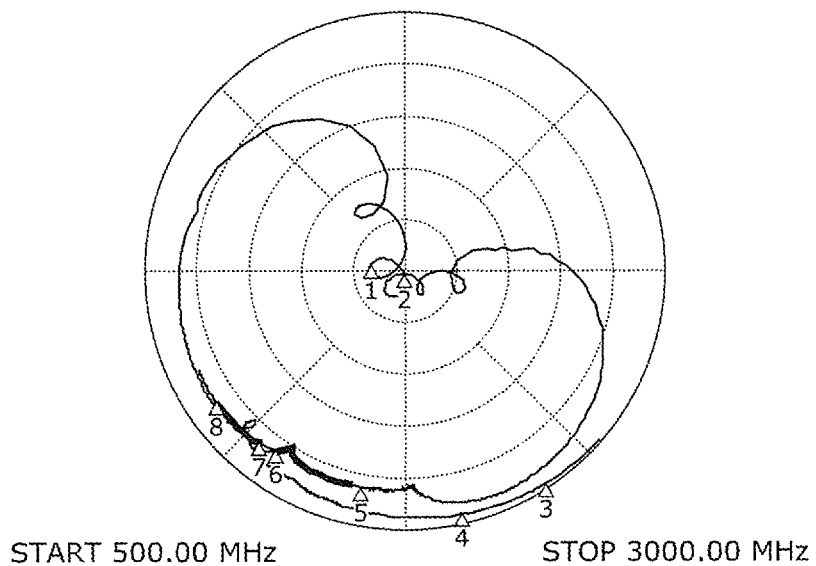
FIG. 3C is a polar chart illustrating a reflection characteristic of the low-frequency filter.

FIG. 3A is a graph that illustrates a wide bandpass characteristic of the low-frequency filter 611L. In addition, FIG. 3B is a graph that illustrates a wide reflection characteristic of the low-frequency filter 611L. Furthermore, FIG. 3C is a polar chart that illustrates a reflection characteristic of the low-frequency filter 611L. In the low-frequency filter 611L formed of SAW resonators, bulk wave radiation is generated in an attenuation band on the high-frequency side of the center frequency $f0_{611L}$, and as illustrated in FIG. 3B, return loss in the case where the low-frequency filter 611L is viewed from the common terminal 110 side is increased in the attenuation band (frequencies greater than or equal to mark 5 in FIG. 3B). As illustrated in FIG. 3A, the loss due to the bulk waves substantially does not affect the attenuation of the low-frequency filter 611L. However, as illustrated in FIG. 3C, the reflection coefficient (|Γ|) in the attenuation band (frequencies greater than or equal to mark 5 in FIG. 3C) is reduced (|Γ|=0.84).

The low-frequency filter 611L formed of SAW resonators has a capacitive characteristic in the attenuation band and functions as a capacitor, and therefore the low-frequency filter 611L functions as a low Q value capacitor in the frequency band where the bulk waves are generated (frequencies greater than or equal to mark 5 in FIG. 3B). Therefore, in the case of the multiplexer 600 having a configuration in which the low-frequency filter 611L and the high-frequency filter 612H are connected to the common terminal 110, the filter characteristic of the high-frequency filter 612H, which has a pass band located at frequencies where the bulk wave loss of the low-frequency filter 611L is generated, is affected by the bulk wave loss of the low-frequency filter 611L, which has a lower pass band. The right-hand side of FIG. 2 illustrates an equivalent circuit diagram of the high-frequency filter 612H at this time. In the equivalent circuit, there is a low-Q-value equivalent capacitance component $C_{LOW-Q}$, which arises from the bulk wave radiation of the low-frequency filter 611L, between the common terminal 110 and a series arm resonator 201 of the high-frequency filter 612H. Consequently, the insertion loss inside the pass band of the high-frequency filter 612H is undesirably increased. In other words, a multiplexer having a configuration in which a plurality of filters are grouped together at a common terminal has a problem in that loss inside the pass band of the high-frequency filter is increased by bulk wave loss of the low-frequency filter.

1.3 Comparison of Characteristics of Multiplexers According to Embodiment and Comparative Example In order to solve the problem of the multiplexer 600 according to the comparative example, in the multiplexer 1 according to this embodiment, as described above, the capacitor $C_{B1}$ is serially arranged on a path (series arm) that connects the common terminal 110 and the series arm resonator 101 to each other. The capacitor $C_{B1}$ has a function of compensating for the bulk wave radiation loss of the SAW resonators of the low-frequency filter 11L in the second pass band. More specifically, the Q value of the capacitor $C_{B1}$ in the second pass band is higher than a capacitance Q value, in the second pass band, of a capacitance component of the SAW resonators of the low-frequency filter 11L.

Figure 4A:
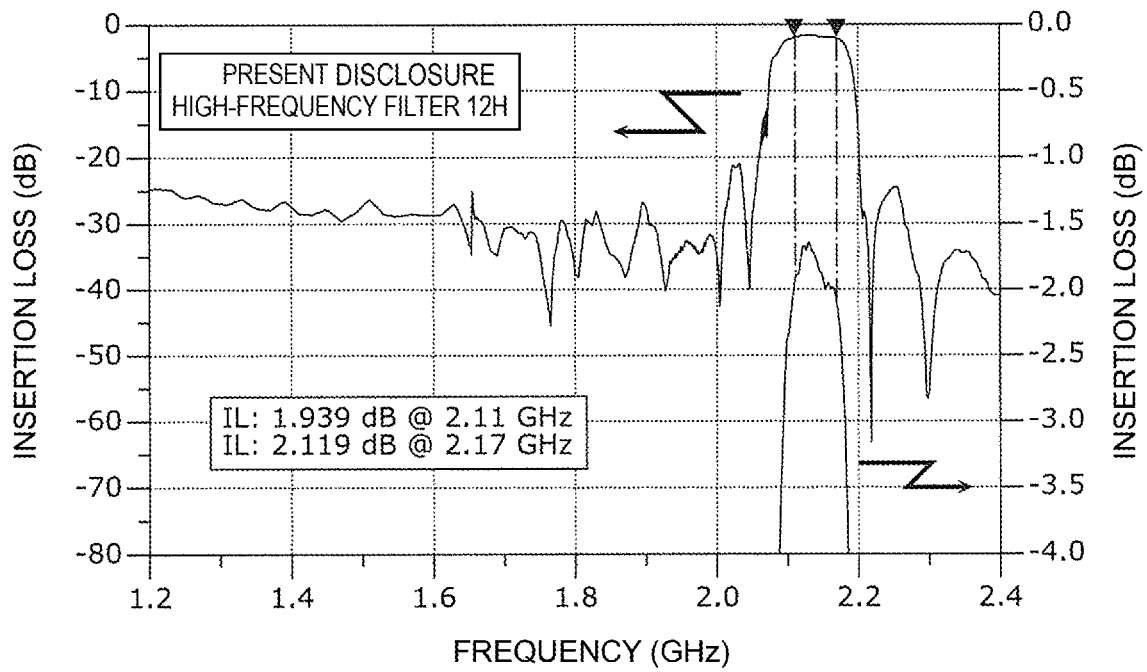
FIG. 4A is a graph illustrating a wide bandpass characteristic of a high-frequency filter according to embodiment 1.
Figure 4B:
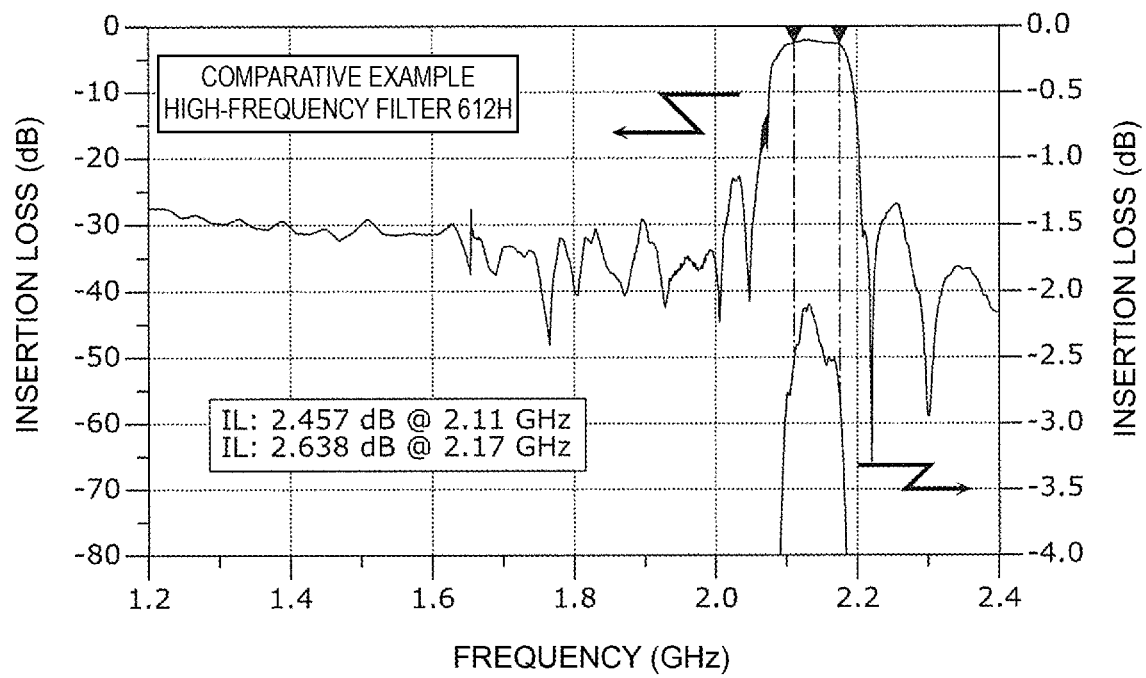
FIG. 4B is a graph illustrating a wide bandpass characteristic of a high-frequency filter according to the comparative example.

FIG. 4A is a graph illustrating a wide bandpass characteristic of the high-frequency filter 12H according to embodiment 1. FIG. 4B is a graph illustrating a wide bandpass characteristic of the high-frequency filter 612H according to the comparative example.

As illustrated in FIG. 4B, in the case of the multiplexer 600 according to the comparative example, the maximum insertion loss inside the pass band (2110-2170 MHz) is 2.638 dB (2170 MHz) in the bandpass characteristic of the high-frequency filter 612H between the common terminal 110 and the input/output terminal 130 due to the bulk wave radiation of the SAW resonators constituting the low-frequency filter 611L.

In contrast, as illustrated in FIG. 4A, in the case of the multiplexer 1 according to embodiment 1, the maximum insertion loss inside the pass band (2110-2170 MHz) is 2.119 dB (2170 MHz), which is an improvement of around 0.5 dB, in the bandpass characteristic of the high-frequency filter 12H between the common terminal 110 and the input/output terminal 130 due to the addition of the capacitor $C_{B1}$ to deal with the bulk wave radiation of the SAW resonators constituting the low-frequency filter 11L.

That is, according to the multiplexer 1 of embodiment 1, the propagation loss of a high-frequency signal can be reduced without arranging a demultiplexing/multiplexing device, a phase adjusting circuit, or the like in a stage prior to the low-frequency filter 11L and the high-frequency filter 12H, and the reductions in size and cost can be realized.

Next, for the case where the capacitance arising from a low-frequency filter is equivalently added in a stage prior to a high-frequency filter as in the equivalent circuit illustrated on the right-hand side of FIG. 2, the relationship between the Q value of the equivalent capacitance component, the reflection coefficient (|Γ|) of the low-frequency filter in the pass band of the high-frequency filter, and the insertion loss in the pass band of the high-frequency filter will be described using FIGS. 5A to 5D.

Figures 5A, 5B:
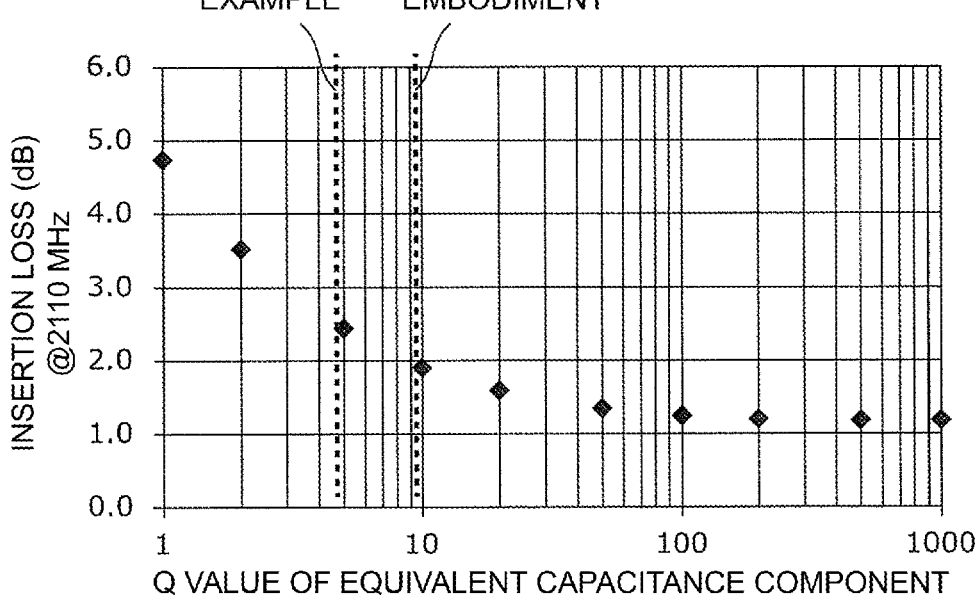
FIG. 5A is a diagram illustrating the relationship between the Q value of an equivalent capacitance component in a stage prior to a high-frequency filter, the reflection coefficient of a low-frequency filter, and the insertion loss of the high-frequency filter.
FIG. 5B is a graph illustrating the relationship between the Q value of the equivalent capacitance component in the stage prior to the high-frequency filter and the insertion loss of the high-frequency filter.

FIG. 5A is a diagram illustrating the relationship between the Q value of the equivalent capacitance component in the stage prior to the high-frequency filter, the reflection coefficient of the low-frequency filter, and the insertion loss of the high-frequency filter. As illustrated in the figure, it is clear that the Q value of the equivalent capacitance component in the stage prior to the high-frequency filter becomes smaller and the insertion loss of the high-frequency filter is degraded as the reflection coefficient (|Γ|) of the low-frequency filter becomes smaller.

Figure 5C:
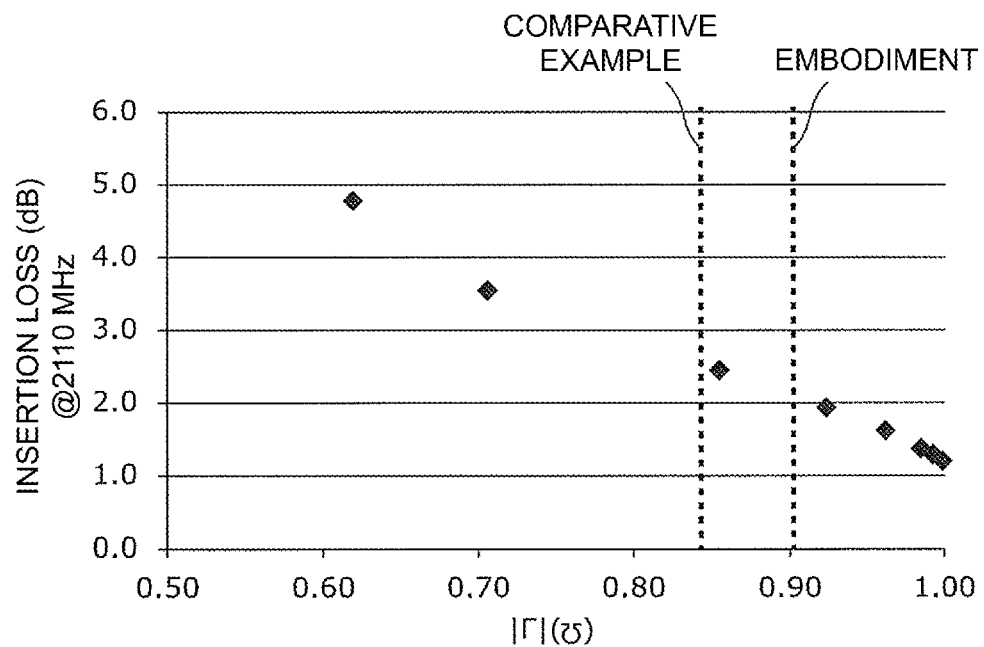
FIG. 5C is a graph illustrating the relationship between the reflection coefficient of the low-frequency filter and the insertion loss of the high-frequency filter.
Figure 5D:
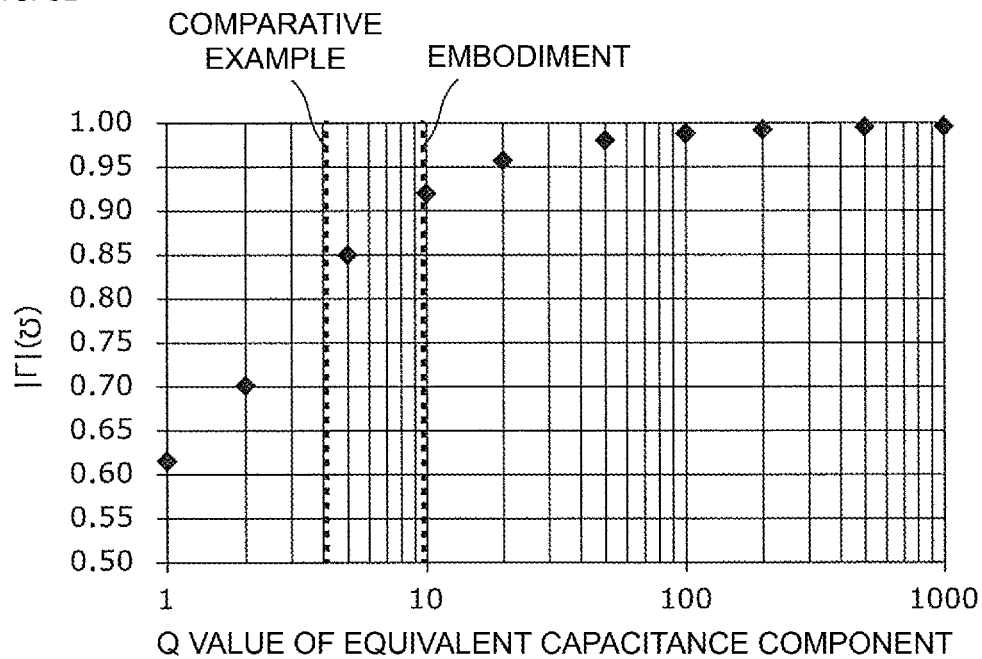
FIG. 5D is a graph illustrating the relationship between the Q value of the equivalent capacitance component in the stage prior to the high-frequency filter and the reflection coefficient of the low-frequency filter.

FIG. 5B is a graph illustrating the relationship between the Q value of the equivalent capacitance component in the stage prior to the high-frequency filter and the insertion loss of the high-frequency filter. In addition, FIG. 5C is a graph illustrating the relationship between the reflection coefficient of the low-frequency filter and the insertion loss of the high-frequency filter. Furthermore, FIG. 5D is a graph illustrating the relationship between the Q value of the equivalent capacitance component in the stage prior to the high-frequency filter and the reflection coefficient of the low-frequency filter. It is clear from FIGS. 5B to 5D that in the case of the multiplexer 600 according to the comparative example, the Q value of the equivalent capacitance component in the stage prior to the high-frequency filter 612H is 5, and in the case of the multiplexer 1 according to embodiment 1, the Q value of the equivalent capacitance component in the stage prior to the high-frequency filter 12H is 10. In addition, it is clear that in the case of the multiplexer 600 according to the comparative example, the reflection coefficient (|Γ|) of the low-frequency filter 611L is 0.84, and in the case of the multiplexer 1 according to embodiment 1, the reflection coefficient (|Γ|) of the low-frequency filter 11L is at least 0.9.

In other words, in the case of the multiplexer 600 according to the comparative example, the reflection coefficient (|Γ|) of the low-frequency filter 611L in the pass band of the high-frequency filter 612H is 0.84. In contrast, in the case of the multiplexer 1 according to embodiment 1, the capacitor $C_{B1}$ is serially arranged in the stage prior to the low-frequency filter 11L, and as a result the reflection coefficient (|Γ|) of the low-frequency filter 11L in the pass band of the high-frequency filter 12H is increased to be at least 0.9 and furthermore the Q value of the equivalent capacitance component in the stage prior to the high-frequency filter 12H is increased from 5 to 10. As a result, the insertion loss of the high-frequency filter 12H according to embodiment 1 is improved from 2.638 dB to 2.119 dB. In addition, in this embodiment, in order to increase the Q value of the equivalent capacitance component of the high-frequency filter 12H from 5 to 10, the Q value of the capacitor $C_{B1}$ in the pass band of the high-frequency filter 12H was set to be around 30 to 40.

[1.4 Configuration of Capacitor]

Next, the configurations of the capacitors $C_{B1}$ and $C_{B2}$ according to embodiment 1 will be described.

FIG. 6A is a plan view illustrating a first example of the electrode layout of the low-frequency filter 11L and the capacitor $C_{B1}$ according to embodiment 1. As illustrated in the figure, the low-frequency filter 11L and the capacitor $C_{B1}$ of the multiplexer 1 are formed on a substrate 100. The interdigital transducer (IDT) electrodes constituting the series arm resonators 101 to 105 and the parallel arm resonators 151 to 154 of the low-frequency filter 11L are formed on the substrate 100 such that the propagation directions of the utilized elastic waves match each other.

In addition, the capacitor $C_{B1}$ is formed on the substrate 100 using comb-shaped electrodes that face each other.

The substrate 100 is a substrate having a piezoelectric property in at least part thereof, and is for example a piezoelectric substrate, or may be formed of a piezoelectric thin film and a support substrate.

Here, a pitch Pc of the plurality of electrode fingers constituting the comb-shaped electrodes of the capacitor $C_{B1}$ is smaller than a pitch λs of the plurality of electrode fingers constituting the IDT electrodes of the series arm resonators 101 to 105 and a pitch λp of the plurality of electrode fingers constituting the IDT electrodes of the parallel arm resonators 151 to 154.

In the multiplexer 1 according to this embodiment, the pitch λs of the electrode fingers of the series arm resonators 101 to 105 of the low-frequency filter 11L is, for example, 2.350 to 2.370 μm, and the pitch λp of the electrode fingers of the parallel arm resonators 151 to 154 of the low-frequency filter 11L is, for example, 2.410 to 2.430 μm. In contrast, the pitch Pc of the electrode fingers of the capacitor $C_{B1}$ is, for example, 1.8 μm.

Similarly to a SAW resonator, the Q value of the capacitor $C_{B1}$ on the substrate 100 is also affected by bulk waves. With the above-described configuration, the frequency of the bulk wave radiation generated by the capacitor $C_{B1}$ is shifted so as to be further toward the high-frequency side than the frequency of the bulk wave radiation generated by the low-frequency filter 11L, and therefore the Q value of the capacitor $C_{B1}$ in the second pass band can be set so as to be higher than the capacitance Q value of the SAW resonators of the low-frequency filter 11L in the second pass band. Therefore, the capacitance Q value in the second pass band can be increased on the common terminal 110 side of the low-frequency filter 11L. Thus, the reflection coefficient (|Γ|) of the low-frequency filter 11L in the second pass band can be increased (return loss can be reduced) and the insertion loss in the second pass band of the high-frequency filter 12H can be improved.

It is preferable that the direction in which the plurality of electrode fingers constituting the comb-shaped electrodes of the capacitor $C_{B1}$ formed on the substrate 100 extend be perpendicular to (intersect) the direction in which the plurality of electrode fingers constituting the resonators of the low-frequency filter 11L extend. As a result, the capacitor $C_{B1}$ suppresses the interference with elastic waves of the low-frequency filter 11L and can function only as a capacitance element.

In addition, in the case where the high-frequency filter 12H is formed of SAW resonators, it is further preferable that the pitch of the plurality of electrode fingers constituting the comb-shaped electrodes of the capacitor $C_{B1}$ be smaller than the pitch of the electrode fingers of the SAW resonators forming the high-frequency filter 12H.

In the multiplexer 1 according to this embodiment, the pitch λs of the electrode fingers of the series arm resonators 201 to 205 of the high-frequency filter 12H is, for example, 1.980 to 2.000 μm, and the pitch λp of the electrode fingers of the parallel arm resonators 251 to 254 of the high-frequency filter 12H is, for example, 2.070 to 2.090 μm. Similarly to a resonator, the Q value of a capacitor on a piezoelectric substrate may also be degraded by bulk waves, and therefore it is preferable to design the capacitor so as to have a narrower pitch than the high-frequency filter. With this configuration, the frequency of the bulk wave radiation generated by the capacitor $C_{B1}$ is shifted so as to be further toward the high-frequency side than the frequency of the bulk wave radiation generated by the high-frequency filter 12H, and therefore the Q value of the capacitor $C_{B1}$ in the second pass band can be set so as to be higher than the capacitance Q value of the SAW resonators of the high-frequency filter 12H in the second pass band. Therefore, the capacitance Q value in the second pass band can be further increased on the common terminal 110 side of the low-frequency filter 11L. Thus, the reflection coefficient (|Γ|) of the low-frequency filter 11L in the second pass band can be increased (return loss can be reduced) and the insertion loss in the second pass band of the high-frequency filter 12H can be improved.

In addition, rather than being formed on the substrate 100, the capacitor $C_{B1}$ may be formed in a plurality of layers inside a multilayer substrate on which the low-frequency filter 11L and the high-frequency filter 12H are mounted and in which a wiring line that connects the low-frequency filter 11L and the high-frequency filter 12H to each other is formed.

Figure 6B:
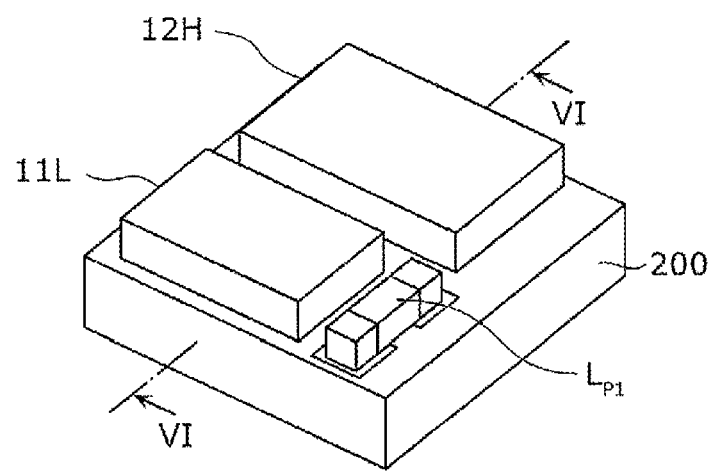
FIG. 6B is an example of an external perspective view of the multiplexer according to embodiment 1.
Figure 6C:
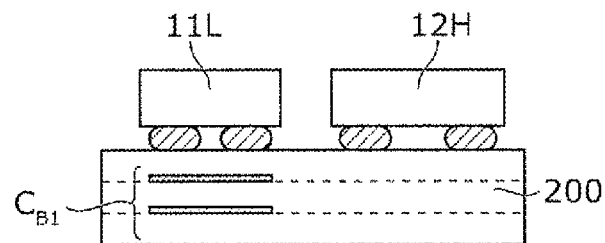
FIG. 6C is a sectional view illustrating a second example of the electrode layout of a low-frequency filter and a capacitor according to embodiment 1.

FIG. 6B is an example of an external perspective view of the multiplexer according to embodiment 1. FIG. 6C is a sectional view illustrating a second example of the electrode layout of the low-frequency filter and the capacitor according to embodiment 1. Specifically, FIG. 6C is a sectional view taken along line VI-VI in FIG. 6B.

As illustrated in the figure, in the multiplexer 1 according to embodiment 1, the low-frequency filter 11L, the high-frequency filter 12H, and the inductor $L_{P1}$ are mounted on a mounting substrate 200.

The mounting substrate 200 has the capacitor $C_{B1}$ and a wiring line that connects the low-frequency filter and the high-frequency filter to each other built thereinto and is, for example, a low-temperature co-fired ceramic (LTCC) substrate.

As illustrated in FIG. 6C, the capacitor $C_{B1}$ is formed across a plurality of layers in the mounting substrate 200, which is a ceramic multilayer substrate. In addition, the mounting substrate 200 may be formed across a plurality of layers in a multilayer substrate composed of a high-temperature co-fired ceramic (HTCC) substrate or a PCB. Furthermore, a multilayer ceramic capacitor (MLCC) may be mounted on a multilayer substrate.

With this configuration, in contrast to the case where the IDT electrodes of the SAW resonators of the low-frequency filter 11L are formed on one surface of the substrate 100, the capacitor $C_{B1}$ is formed of a plurality of planar electrodes that face each other disposed with a dielectric layer therebetween, and therefore the Q value of the capacitor in the second pass band can be designed so as to be higher than the capacitance Q values of the SAW resonators of the low-frequency filter 11L in the second pass band. Therefore, the capacitance Q value in the second pass band can be increased on the common terminal 110 side of the low-frequency filter 11L. Thus, the reflection coefficient (|Γ|) of the low-frequency filter 11L in the second pass band can be increased (return loss can be reduced) and the insertion loss in the second pass band of the high-frequency filter 12H can be improved.

[1.5 Modifications of Low-Frequency Filter and High-Frequency Filter]

Figure 7A:
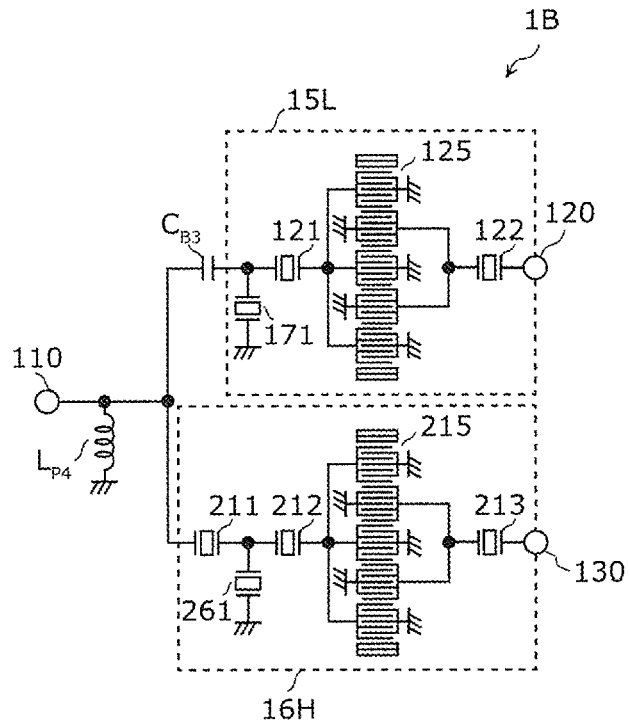
FIG. 7A is a circuit configuration diagram of a multiplexer according to modification 2 of embodiment 1.

FIG. 7A is a circuit configuration diagram of a multiplexer 1B according to modification 2 of embodiment 1. As illustrated in the figure, a low-frequency filter and a high-frequency filter of a multiplexer according to the present disclosure may have a configuration that includes a longitudinally coupled SAW resonator unit. The multiplexer 1B according to this modification includes a low-frequency filter 15L, a high-frequency filter 16H, a capacitor $C_{B3}$, an inductor $L_{P4}$, a common terminal 110, and input/output terminals 120 and 130. The multiplexer 1B is a composite elastic wave filter device that includes the low-frequency filter 15L and the high-frequency filter 16H, which are connected to the common terminal 110.

The low-frequency filter 15L is a first filter that is arranged between the common terminal 110 and the input/output terminal 120 (first input/output terminal) and has a first pass band (center frequency $f0_{15L}$). The low-frequency filter 15L is configured as a band pass filter, and includes series arm resonators 121 and 122, which are connected in a series arm connected between the common terminal 110 and the input/output terminal 120, a parallel arm resonator 171 that is connected in a parallel arm connected between the series arm and a ground terminal, and a longitudinally coupled SAW resonator unit 125 that is connected to the series arm resonators 121 and 122. The series arm resonators 121 and 122, the parallel arm resonator 171, and the five resonators constituting the longitudinally coupled SAW resonator unit 125 are SAW resonators. The SAW resonators of the low-frequency filter 15L utilize leaky waves using a $LiTaO_3$ substrate or Love waves using a $LiNbO_3$ substrate.

The high-frequency filter 16H is a second filter that is arranged between the common terminal 110 and the input/output terminal 130 (second input/output terminal) and has a second pass band (center frequency $f0_{16H}$ ($>f0_{15L}$)) located at a higher frequency than the first pass band. The high-frequency filter 16H is configured as a band pass filter, and includes series arm resonators 211, 212, and 213, which are connected in a series arm connected between the common terminal 110 and the input/output terminal 130, a parallel arm resonator 261, which is connected in a parallel arm connected between the series arm and a ground terminal, and a longitudinally coupled SAW resonator unit 215, which is connected to the series arm resonators 212 and 213. In addition, the resonator that is connected closest to the common terminal 110 among the resonators is the series arm resonator 211. The series arm resonators 211, 212, and 213, the parallel arm resonator 261, and the five resonators constituting the longitudinally coupled SAW resonator unit 215 are SAW resonators. In addition, the resonators may be elastic wave resonators that utilize boundary acoustic waves or BAW. In addition, the high-frequency filter 16H may have a configuration that does not include elastic wave resonators such as an LC resonance circuit.

The capacitor $C_{B3}$ is serially arranged on a path (series arm) that connects the common terminal 110 and the parallel arm resonator 171 to each other. Here, the Q value of the capacitor $C_{B3}$ in the second pass band is higher than capacitance Q value, in the second pass band, of a capacitance component of the SAW resonators of the low-frequency filter 15L. In other words, the capacitor $C_{B3}$ has a function of compensating for bulk wave radiation loss of the SAW resonators of the low-frequency filter 15L in the second pass band.

The inductor $L_{P4}$ is connected between the common terminal 110 and a ground terminal. In this way, impedance matching can be secured between the antenna element and each filter.

With this configuration, the reflection coefficient (|Γ|) of the low-frequency filter 15L in the second pass band can be increased (return loss can be reduced), and therefore the insertion loss in the second pass band of the high-frequency filter 16H, which is connected to the common terminal 110 along with the low-frequency filter 15L, can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

Figure 7B:
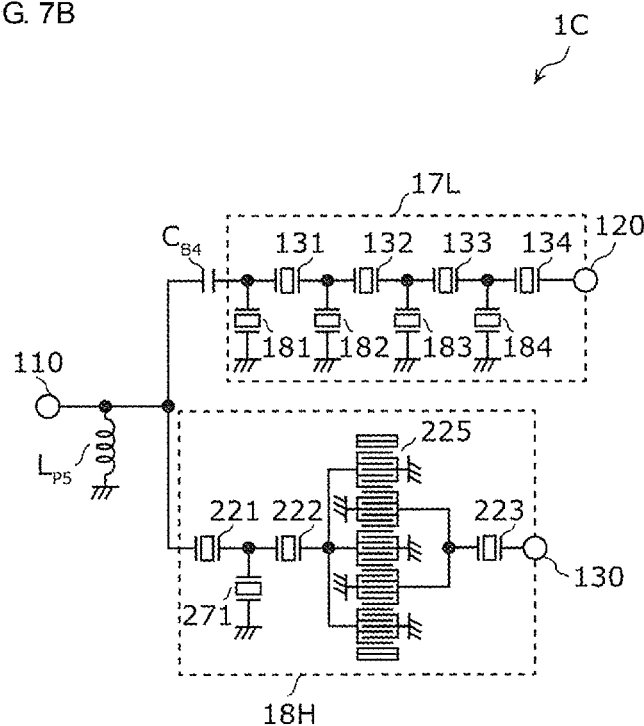
FIG. 7B is a circuit configuration diagram of a multiplexer according to modification 3 of embodiment 1.

FIG. 7B is a circuit configuration diagram of a multiplexer 1C according to modification 3 of embodiment 1. As illustrated in the figure, a low-frequency filter 17L may be a ladder SAW filter and a high-frequency filter 18H may be a SAW filter that includes a longitudinally coupled SAW resonator unit 225.

The multiplexer 1C according to this modification includes the low-frequency filter 17L, the high-frequency filter 18H, a capacitor $C_{B4}$, an inductor $L_{P5}$, a common terminal 110, and input/output terminals 120 and 130.

The low-frequency filter 17L is a first filter that has a first pass band (center frequency $f0_{17L}$). The low-frequency filter 17L is configured as a ladder band pass filter, and includes series arm resonators 131, 132, 133, and 134, which are connected in a series arm connected between the common terminal 110 and the input/output terminal 120, and parallel arm resonators 181, 182, 183, and 184, which are connected in parallel arms connected between the series arm and ground terminals.

The high-frequency filter 18H is a second filter having a second pass band (center frequency $f0_{18H}$ ($>f0_{17L}$)) located at a higher frequency than the first pass band and has the same configuration as the high-frequency filter 16H according to modification 2. The high-frequency filter 18H is configured as a band pass filter, and includes series arm resonators 221, 222, and 223, which are connected in a series arm connected between the common terminal 110 and the input/output terminal 130, a parallel arm resonator 271 that is connected in a parallel arm connected between the series arm and a ground terminal, and a longitudinally coupled SAW resonator unit 225 that is connected to the series arm resonators 222 and 223. In addition, the resonator that is connected closest to the common terminal 110 among the resonators is the series arm resonator 221.

With this configuration, the reflection coefficient ($|\Gamma|$) of the low-frequency filter 17L in the second pass band can be increased (return loss can be reduced), and therefore the insertion loss in the second pass band of the high-frequency filter 18H, which is connected to the common terminal 110 along with the low-frequency filter 17L, can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

Embodiment 2

In embodiment 1, a two-branch demultiplexing/multiplexing multiplexer having a configuration in which a low-frequency filter and a high-frequency filter are connected to a common terminal is exemplified, whereas a three-branch demultiplexing/multiplexing multiplexer having a configuration in which three filters having different pass bands are connected to a common terminal will be described in this embodiment.

[2.1 Circuit Configuration of Multiplexer]

Figure 8A:
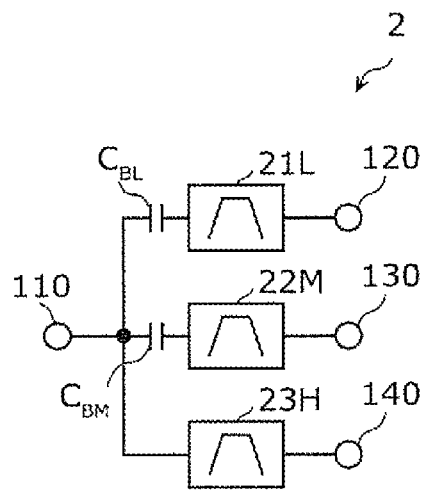
FIG. 8A is a circuit block diagram of a multiplexer according to embodiment 2.

FIG. 8A is a circuit configuration diagram of a multiplexer 2 according to embodiment 2. As illustrated in the figure, the multiplexer 2 includes a low-band filter 21L, a middle-band filter 22M, a high-band filter 23H, capacitors $C_{BL}$ and $C_{BM}$, a common terminal 110, and input/output terminals 120, 130, and 140. The multiplexer 2 is a composite elastic wave filter device that includes the low-band filter 21L, the middle-band filter 22M, and the high-band filter 23H, which are connected to the common terminal 110.

For example, the common terminal 110 can be connected to an antenna element and the input/output terminals 120, 130, and 140 can be connected to a high-frequency signal processing circuit via an amplification circuit.

The low-band filter 21L is a first filter that is arranged between the common terminal 110 and the input/output terminal 120 (first input/output terminal) and has a first pass band (center frequency $f0_{21L}$). The low-band filter 21L is formed of at least one SAW resonator.

The middle-band filter 22M is a third filter that is arranged between the common terminal 110 and the input/output terminal 130 (first input/output terminal) and has a third pass band (center frequency $f0_{22M}$) located at a higher frequency than the first pass band. The middle-band filter 22M is formed of at least one SAW resonator.

The high-band filter 23H is a second filter that is arranged between the common terminal 110 and the input/output terminal 140 (second input/output terminal) and has a second pass band (center frequency $f0_{23H}$ ($>f0_{22M}$)) located at higher frequencies than the third pass band. The high-band filter 23H is formed of at least one SAW resonator. In addition, in this embodiment, the resonators constituting the high-band filter 23H are all SAW resonators, but the resonators may instead be elastic wave resonators that utilize boundary acoustic waves or BAW. Furthermore, the high-band filter 23H may have a configuration that does not include elastic wave resonators such as an LC resonance circuit.

The capacitor $C_{BL}$ is serially arranged on a path (series arm) that connects the common terminal 110 and the low-band filter 21L to each other. Here, the Q valued of the capacitor $C_{BL}$ in the second pass band and the third pass band are higher than the capacitance Q values of the capacitance component of the SAW resonators of the low-band filter 21L in the second pass band and the third pass band. In other words, the capacitor $C_{BL}$ has a function of compensating for bulk wave radiation loss of the SAW resonators of the low-band filter 21L in the second pass band and the third pass band.

The capacitor $C_{BM}$ is serially arranged on a path (series arm) that connects the common terminal 110 and the middle-band filter 22M to each other. Here, the Q value of the capacitor $C_{BM}$ in the second pass band is higher than the capacitance Q value of the capacitance component of the SAW resonators of the middle-band filter 22M in the second pass band. In other words, the capacitor $C_{BM}$ has a function of compensating for the bulk wave radiation loss of the SAW resonators of the middle-band filter 22M in the second pass band.

Figure 8B:
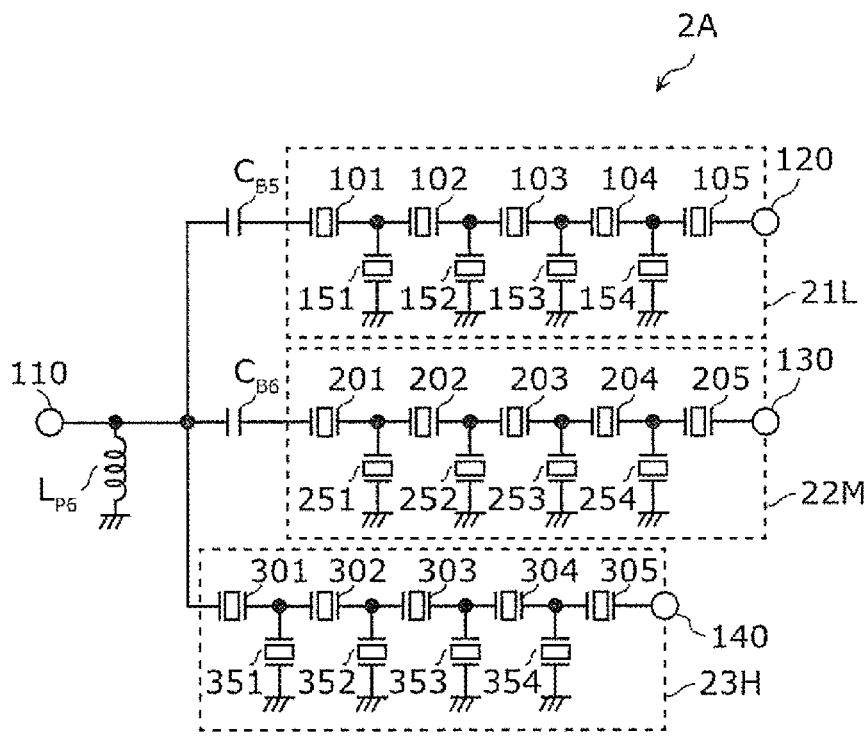
FIG. 8B is a circuit configuration diagram of the multiplexer according to embodiment 2.

FIG. 8B is a circuit configuration diagram of a multiplexer 2A according to embodiment 2. The multiplexer 2A illustrated in the figure represents a specific circuit configuration of the multiplexer 2. As illustrated in the figure, the multiplexer 2A includes the low-band filter 21L, the middle-band filter 22M, the high-band filter 23H, capacitors $C_{B5}$ and $C_{B6}$, an inductor $L_{P6}$, the common terminal 110, and the input/output terminals 120, 130, and 140.

The low-band filter 21L has the same configuration as the low-frequency filter 11L according to embodiment 1. The SAW resonators of the low-band filter 21L utilize leaky waves using a LiTaO$_3$ substrate or Love waves using a LiNbO$_3$ substrate.

The middle-band filter 22M is configured as a ladder band pass filter, has the same resonator configuration as the low-band filter 21L, and includes series arm resonators 201 to 205, which are connected in a series arm connected between the common terminal 110 and the input/output terminal 130, and parallel arm resonators 251 to 254, which are connected in parallel arms connected between the series arm and the ground terminals. The SAW resonators of the middle-band filter 22M utilize leaky waves using a LiTaO$_3$ substrate or Love waves using a LiNbO$_3$ substrate.

The high-band filter 23H is configured as a ladder band pass filter, has the same configuration as the high-frequency filter 12H according to embodiment 1, and includes series arm resonators 301 to 305, which are connected in a series arm connected between the common terminal 110 and the input/output terminal 130, and parallel arm resonators 351 to 354, which are connected in parallel arms connected between the series arm and ground terminals. In addition, the resonator that is connected closest to the common terminal 110 among the series arm resonators 301 to 305 and the parallel arm resonators 351 to 354 is the series arm resonator 301.

The capacitor $C_{B5}$ is the capacitor $C_{BL}$ in the multiplexer 2 and the capacitor $C_{B6}$ is the capacitor $C_{BM}$ in the multiplexer 2.

The inductor $L_{P6}$ is connected between the common terminal 110 and a ground terminal. In this way, impedance matching can be secured between the antenna element and each filter.

Due to the capacitor $C_{B5}$ being arranged, the reflection coefficient ($|\Gamma|$) of the low-band filter 21L in the second pass band and the third pass band can be increased (return loss can be reduced), and therefore the insertion loss in the second pass band of the high-band filter 23H and in the third pass band of the middle-band filter 22M, these filters being connected to the common terminal 110 along with the low-band filter 21L, can be improved.

In addition, due to the capacitor $C_{B6}$ being arranged, the reflection coefficient ($|\Gamma|$) of the middle-band filter 22M in the second pass band can be increased (return loss can be reduced), and therefore the insertion loss in the second pass band of the high-band filter 23H, which is connected to the common terminal 110 along with the middle-band filter 22M, can be improved.

With the above-described configuration, the propagation loss of a high-frequency signal can be reduced without arranging a three-branch demultiplexing/multiplexing device, a phase adjusting circuit, and so on in a stage prior to the filters, and the reductions in size and cost can be realized.

Figure 8C:
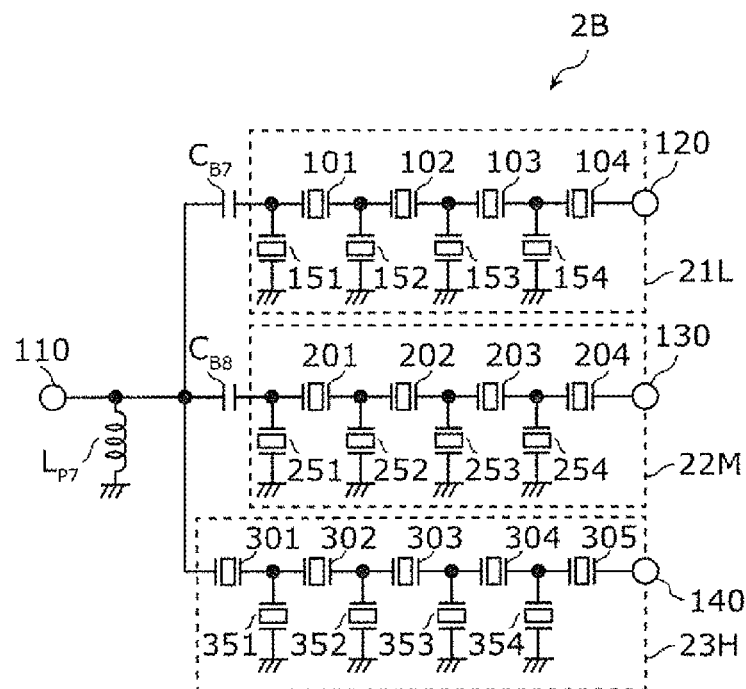
FIG. 8C is a circuit configuration diagram of a multiplexer according to modification 1 of embodiment 2.

FIG. 8C is a circuit configuration diagram of a multiplexer 2B according to modification 1 of embodiment 2. The multiplexer 2B illustrated in the figure differs from the multiplexer 2A according to embodiment 2 only with respect to the circuit configurations of the low-band filter 21L and the middle-band filter 22M. Hereafter, only the parts of the configuration of the multiplexer 2B according to this modification that differ from those of the multiplexer 2A according to embodiment 2 will be described.

A low-band filter 21L according to this modification has the same configuration as the low-frequency filter 13L according to modification 1 of embodiment 1.

The middle-band filter 22M according to this modification has the same resonator configuration as the low-band filter 21L according to this modification.

A capacitor $C_{B7}$ is the capacitor $C_{BL}$ in the multiplexer 2 and a capacitor $C_{B8}$ is the capacitor $C_{BM}$ in the multiplexer 2.

In other words, in a multiplexer according to the present disclosure, the resonators of the low-band filter 21L and the middle-band filter 22M that are arranged in the stage after the capacitors $C_{BL}$ and $C_{BM}$ and are connected closest to the common terminal may each be a series arm resonator or a parallel arm resonator.

Figure 8D:
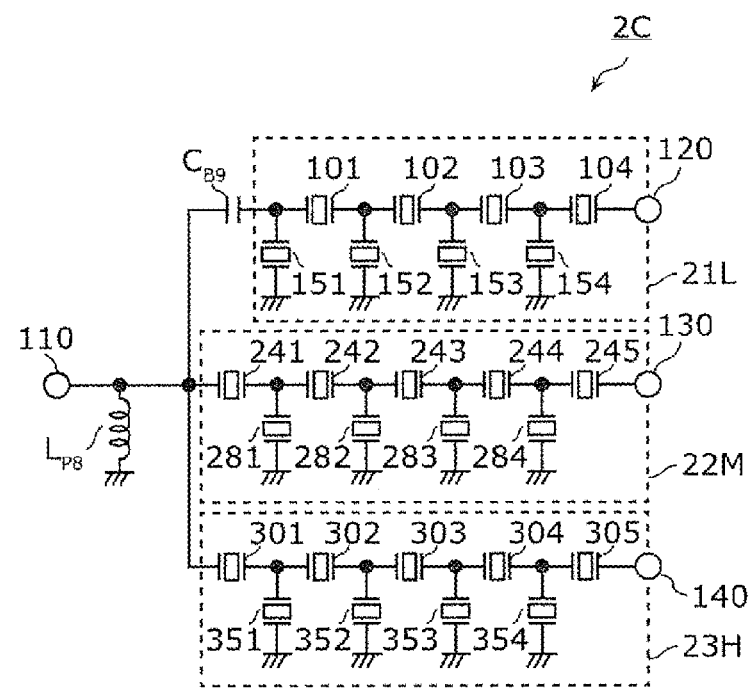
FIG. 8D is a circuit configuration diagram of a multiplexer according to modification 2 of embodiment 2.

FIG. 8D is a circuit configuration diagram of a multiplexer 2C according to modification 2 of embodiment 2. The multiplexer 2C illustrated in the figure differs from the multiplexer 2A according to embodiment 2 only with respect to the configurations of the low-band filter 21L and the middle-band filter 22M. Hereafter, only the parts of the configuration of the multiplexer 2C according to this modification that differ from those of the multiplexer 2A according to embodiment 2 will be described.

A low-band filter 21L according to this modification has the same configuration as the low-band filter 21L according to modification 1 of embodiment 2. Here, the SAW resonators of the low-band filter 21L according to this modification utilizes Rayleigh waves that propagate along a LiTaO$_3$ piezoelectric substrate. In addition, the SAW resonators of the low-band filter 21L according to this modification may instead utilizes Love wave that propagate along a LiNbO$_3$ piezoelectric substrate.

A capacitor $C_{B9}$ is the capacitor $C_{BL}$ in the multiplexer 2.

Due to the capacitor $C_{B9}$ being arranged, the reflection coefficient ($|\Gamma|$) of the low-band filter 21L in the second pass band can be increased (return loss can be reduced), and therefore the insertion loss in the second pass band of the high-band filter 23H, which is connected to the common terminal 110 along with the low-band filter 21L, can be improved.

The middle-band filter 22M is configured as a ladder band pass filter, has the same resonator configuration as the middle-band filter 22M according to embodiment 2, and includes series arm resonators 241 to 245, which are connected in a series arm connected between the common terminal 110 and the input/output terminal 130, and parallel arm resonators 281 to 284, which are connected in parallel arms connected between the series arm and ground terminals. Here, the SAW resonators of the middle-band filter 22M according to this modification utilize Rayleigh waves that propagate along a LiNbO$_3$ piezoelectric substrate, and a capacitor is not serially arranged on a path connected between the common terminal 110 and the middle-band filter 22M.

In a SAW resonator utilizing Rayleigh waves using a LiNbO$_3$ piezoelectric substrate, the frequency at which bulk wave radiation is generated on the high-frequency side of the anti-resonant point lies in a frequency band located at a frequency at least twice the frequency of the anti-resonant point and is sufficiently higher than the pass band of a filter used in a cellular phone multiplexer, and there is substantially no effect from the bulk wave radiation on other filters. As a result, the reflection coefficient ($|\Gamma|$) of the middle-band filter 22M according to this modification in the second pass band is not reduced by the bulk wave radiation. Therefore, the propagation loss of a high-frequency signal can be reduced without arranging a capacitor in the stage prior to the middle-band filter 22M according to this modification, and the reductions in size and cost can be realized.

Figure 8E:
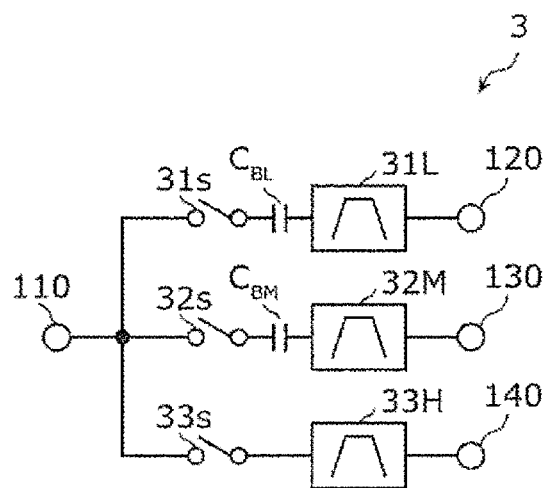
FIG. 8E is a circuit block diagram of a multiplexer according to modification 3 of embodiment 2.

FIG. 8E is a circuit block diagram of a multiplexer 3 according to modification 3 of embodiment 2. As illustrated in the figure, the multiplexer 3 according to this modification includes a low-band filter 31L, a middle-band filter 32M, a high-band filter 33H, capacitors $C_{BL}$ and $C_{BM}$, a common terminal 110, input/output terminals 120, 130, and 140, and switches 31s, 32s, and 33s. The multiplexer 3 is a composite elastic wave filter device that includes the low-band filter 31L, the middle-band filter 32M, and the high-band filter 33H, which are connected to the common terminal 110.

The multiplexer 3 according to this modification differs from the multiplexer 2 according to embodiment 2 in that the switches 31s, 32s, and 33s are respectively arranged along paths that connect the common terminal 110, the low-band filter 31L, the middle-band filter 32M, and the high-band filter 33H to each other. Hereafter, only the parts of the configuration of the multiplexer 3 according to this modification that differ from those of the multiplexer 2 according to embodiment 2 will be described.

As described above, the switches 31s, 32s, and 33s, which switch the signal paths between being connected and disconnected, are arranged between the common terminal 110 and the filters, and the switches 31s to 33s are controlled in accordance with the frequency band (band) to be used, and consequently there is no need to consider the reflection coefficient of a filter on a line disconnected by a switch. Therefore, the insertion loss in the pass band of each filter can be improved.

Figure 8F:
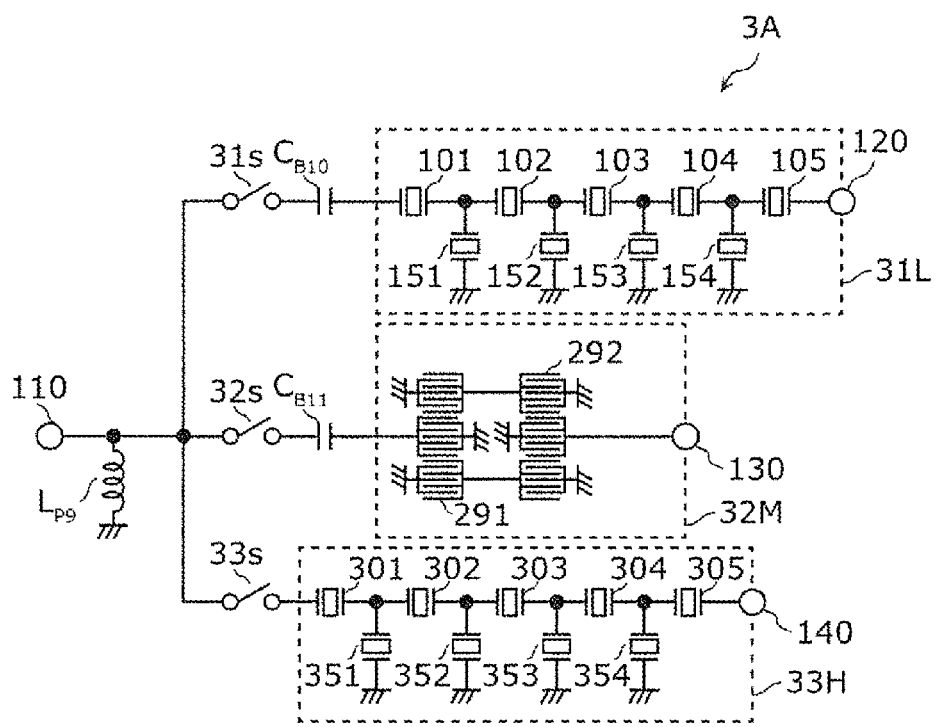
FIG. 8F is a circuit configuration diagram of a multiplexer according to modification 3 of embodiment 2.

FIG. 8F is a circuit configuration diagram of a multiplexer 3A according to modification 3 of embodiment 2. The multiplexer 3A illustrated in the figure exemplifies a specific circuit configuration of the multiplexer 3. As illustrated in the figure, the multiplexer 3A includes the low-band filter 31L, the middle-band filter 32M, the high-band filter 33H, capacitors $C_{B10}$ and $C_{B11}$, an inductor $L_{P9}$, the common terminal 110, the input/output terminals 120, 130, and 140, and the switches 31s, 32s, and 33s.

The low-band filter 31L has the same configuration as the low-frequency filter 21L according to embodiment 2. The SAW resonators of the low-band filter 21L utilize leaky waves using a $LiTaO_3$ substrate or Love waves using a $LiNbO_3$ substrate.

The middle-band filter 32M is configured as a band pass filter, and includes longitudinal coupled SAW resonance units 291 and 292 connected in a series arm connected between the common terminal 110 and the input/output terminal 130. The six resonators that form the longitudinal coupled SAW resonance units 291 and 292 are SAW resonators. The SAW resonators of the middle-band filter 32M utilize leaky waves using a $LiTaO_3$ substrate or Love waves using a $LiNbO_3$ substrate.

The high-band filter 33H is configured as a ladder band pass filter, has the same configuration as the high-frequency filter 23H according to embodiment 2, and includes the series arm resonators 301 to 305, which are connected in a series arm connected between the common terminal 110 and the input/output terminal 130, and the parallel arm resonators 351 to 354, which are connected in parallel arms connected between the series arm and ground terminals. In addition, the resonator that is connected closest to the common terminal 110 among the series arm resonators 301 to 305 and the parallel arm resonators 351 to 354 is the series arm resonator 301.

The capacitor $C_{B10}$ is the capacitor $C_{BL}$ in the multiplexer 3 and the capacitor $C_{B11}$ is the capacitor $C_{BM}$ in the multiplexer 3.

The inductor $L_{P9}$ is connected between the common terminal 110 and a ground terminal. In this way, impedance matching can be secured between the antenna element and each filter.

The switches 31s, 32s, and 33s, which switch signal paths between being connected and disconnected, are arranged between the common terminal 110 and the filters as in this configuration, the switches 31s to 33s are controlled in accordance with the frequency band (band) to be used, and consequently there is no need to consider the reflection coefficient of a filter on a line disconnected by a switch. Therefore, the insertion loss in the pass band of each filter can be improved.

Embodiment 3

The multiplexers according to embodiments 1 and 2 and the modifications thereof described thereabove can also be applied to a front end circuit and to a communication device that includes such a front end circuit. Accordingly, such a high-frequency front end circuit and such a communication device will be described in this embodiment.

Figure 9:
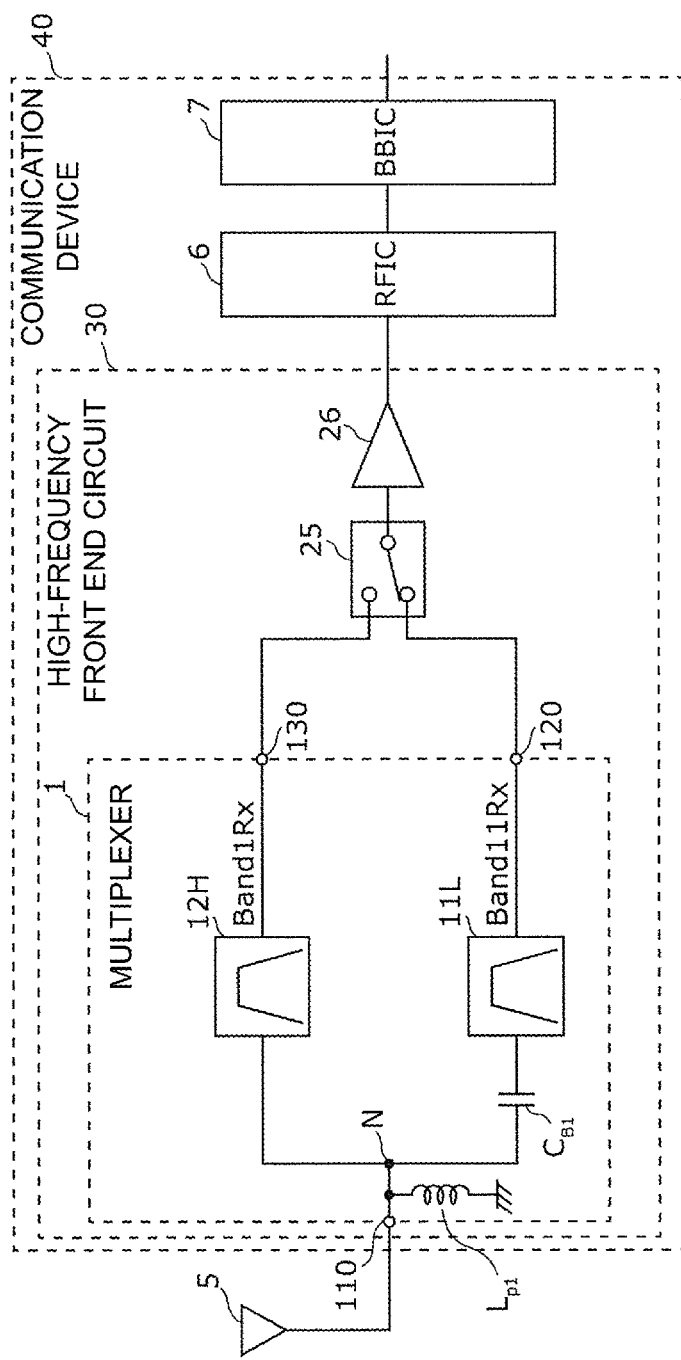
FIG. 9 is a circuit configuration diagram of a high-frequency front end circuit and a communication device according to embodiment 3.
Figure 10:
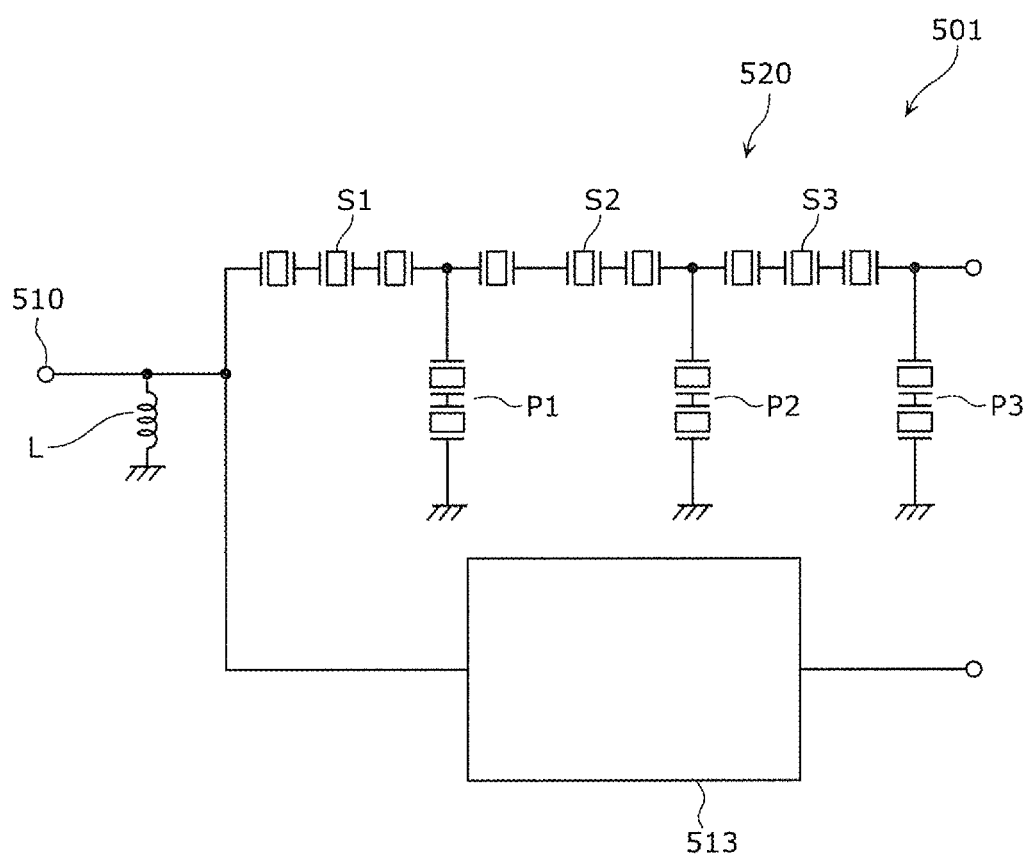
FIG. 10 is a circuit configuration diagram of a surface acoustic wave filter device disclosed in Patent Document 1.

FIG. 9 is a circuit configuration diagram of a high-frequency front end circuit 30 and a communication device 40 according to embodiment 3. In this figure, an antenna element 5 connected to the communication device 40 is also illustrated. The communication device 40 is formed of the high-frequency front end circuit 30, an RF signal processing circuit (RFIC) 6, and a baseband signal processing circuit (BBIC) 7.

The high-frequency front end circuit 30 includes a multiplexer 1, a switch 25, and a low-noise amplification circuit 26.

The multiplexer 1 is the multiplexer 1 according to embodiment 1, for example.

The switch 25 is a switch circuit having two selection terminals that are individually connected to the input/output terminals 120 and 130 of the multiplexer 1 and a common terminal that is connected to the low-noise amplification circuit 26. The switch 25 is formed of a single pole double throw (SPDT) switch for example, and connects the common terminal and a signal path corresponding to a prescribed band in accordance with a control signal from a control unit (not illustrated). The number of selection terminals connected to the common terminal is not limited to one and may be plural. In other words, the high-frequency front end circuit 30 may support carrier aggregation.

The low-noise amplification circuit 26 is a reception amplification circuit that amplifies a high-frequency signal (in this case, high-frequency reception signal) received via the antenna element 5, the multiplexer 1, and the switch 25 and outputs the amplified signal to the RF signal processing circuit 6.

The RF signal processing circuit 6 subjects a high-frequency reception signal input thereto from the antenna element 5 via a reception signal path to signal processing using down conversion and so forth, and outputs the reception signal generated through this signal processing to the baseband signal processing circuit 7. The RF signal processing circuit 6 is an RFIC, for example.

A signal processed by the baseband signal processing circuit 7 is used for image display as an image signal or for a phone call as an audio signal, for example.

The high-frequency front end circuit 30 may include other circuit elements between the above-described constituent elements.

The thus-configured high-frequency front end circuit 30 and communication device 40 include a multiplexer according to embodiment 1 or 2 or a modification thereof, and as a result, the propagation loss of a high-frequency signal can be reduced without arranging a demultiplexing/multiplexing device, a phase adjusting circuit, or the like in a stage prior to the filters, and the reductions in size and cost can be realized.

The high-frequency front end circuit 30 may include a triplexer or a quadplexer capable of handling both transmission and reception instead of the multiplexer 1 according to embodiment 1.

In addition, depending on the high-frequency signal processing method used, the communication device 40 may not have to include the baseband signal processing circuit 7.

(Other Modifications Etc.)

Multiplexers, a high-frequency front end circuit, and a communication device according to embodiments of the present disclosure have been described above in the form of embodiments and modifications thereof, but other embodiments realized by combining any of the constituent elements of the above-described embodiments and modifications with one another, modifications obtained by modifying the above-described embodiments in various ways, as thought of by one skilled in the art, without departing from the gist of the present disclosure, and various devices having a high-frequency filter circuit and a front-end module according to the present disclosure built thereinto are also included in the present disclosure.

For example, in the above-described disclosures, a two-branch demultiplexing/multiplexing circuit in which two reception signal paths are connected to a common terminal and a three-branch demultiplexing/multiplexing circuit in which three reception signal paths or transmission signal paths are connected to a common terminal are described as examples of a multiplexer, but the present disclosure can also be applied to a circuit that includes both transmission paths and reception paths and a demultiplexing/multiplexing circuit in which four or more signal paths are connected to a common terminal, for example.

In other words, in a multiplexer in which (n) filters having center frequencies f1, f2, . . . , fn (n is a natural number greater than or equal to 2) are connected to a common terminal, in a first filter, which is at least one filter other than a filter having the highest center frequency fn (second filter), a capacitor is serially arranged on a connection path (series arm) connected between the common terminal and the first filter. In this case, the Q value of the capacitor in the pass band of the second filter (second pass band) is higher than a capacitance Q value in the second pass band obtained when the SAW resonators of the first filter are viewed as a capacitance. In other words, the capacitor has a function of compensating for bulk wave radiation loss of the SAW resonators of the first filter in the second pass band.

As a result, the reflection coefficient (|Γ|) of the first filter in the second pass band can be increased (return loss can be reduced), and therefore the insertion loss in the second pass band of the second filter, which is connected to the common terminal along with the first filter, can be improved. Therefore, the propagation loss of a high-frequency signal can be reduced without arranging a demultiplexing/multiplexing device, a phase adjusting circuit, or the like in a stage prior to the filters, and the reductions in size and cost can be realized.

Furthermore, Band 1 and Band 11 of the LTE standard are used as an example of the frequency bands (bands) used in a multiplexer in the above-described embodiments, but the present disclosure is not limited to this example.

In addition, in the above-described embodiments, the meaning of "two or more filters are connected to a common terminal" includes not only a configuration in which two or more filters are directly connected to a common terminal but also includes a configuration in which two or more filters are indirectly connected to a common terminal using the following kind of configuration. For example, a configuration may be adopted in which a branching circuit that enables one or more conductive paths to be obtained such as a switch, a phase circuit or a power splitter (divider) is arranged between the common terminal and two or more filters.

In addition, in each filter of a multiplexer, additionally, an inductor or a capacitor may be connected between terminals such as an input/output terminal and a ground terminal or a circuit element other than an inductor or a capacitor such as a resistance element may be added.

The present disclosure can be widely used in communication devices such as cellular phones as a multiplexer, a high-frequency front end circuit, and a communication device that can be applied to frequency standards that support multiple bands and multiple modes and that have low loss, are compact, and are low cost.

1, 1A, 1B, 1C, 2, 2A, 2B, 2C, 600 multiplexer
5 antenna element
6 RF signal processing circuit (RFIC)
7 baseband signal processing circuit (BBIC)
11L, 13L, 15L, 17L, 611L low-frequency filter
12H, 16H, 18H, 612H high-frequency filter
21L low-band filter
22M middle-band filter
23H high-band filter
25 switch
26 low-noise amplification circuit
30 high-frequency front end circuit
40 communication device
100 substrate
101, 102, 103, 104, 105, 111, 112, 113, 114, 121, 122, 131, 132, 133, 134, 201, 202, 203, 204, 205, 211, 212, 213, 221, 222, 223, 241, 242, 243, 244, 245, 301, 302, 303, 304, 305 series arm resonator
110 common terminal
120, 130, 140 input/output terminal
125, 215, 225 longitudinally coupled SAW resonator unit
151, 152, 153, 154, 161, 162, 163, 164, 171, 181, 182, 183, 184, 251, 252, 253, 254, 261, 271, 281, 282, 283, 284, 351, 352, 353, 354 parallel arm resonator
$C_{B1}, C_{B2}, C_{B3}, C_{B4}, C_{B5}, C_{B6}, C_{B7}, C_{B8}, C_{B9}, C_{BL}, C_{BM}$ capacitor
$L_{P1}, L_{P2}, L_{P3}, L_{P4}, L_{P5}, L_{P6}, L_{P7}, L_{P8}$ inductor

The invention claimed is:

1. A multiplexer comprising:
a common terminal;
a first input/output terminal;
a second input/output terminal;
a plurality of filters connected to the common terminal, the plurality of filters including a first filter and a second filter, wherein:
the first filter has a first pass band and is formed from at least one surface acoustic wave resonator arranged between the common terminal and the first input/output terminal, and
the second filter has a second pass band and is connected between the common terminal and the second input/output terminal, the second pass band having a higher frequency than the first pass band; and
a capacitor that is serially arranged on a path between the common terminal and the first filter and that is configured to compensate for bulk wave radiation loss of the at least one surface acoustic wave resonator in the second pass band.

2. The multiplexer according to claim 1, wherein:
the first filter comprises a substrate having a piezoelectric property and on which an interdigital transducer (IDT) electrode constituting the at least one surface acoustic wave resonator is formed,
the capacitor is formed on the substrate with comb-shaped electrodes that face each other, and
a pitch of a plurality of electrode fingers constituting the comb-shaped electrodes is less than a pitch of a plurality of electrode fingers constituting the IDT electrode.

3. The multiplexer according to claim 1, further comprising:
a wiring line that connects the first filter and the second filter to each other, wherein:
the capacitor is formed in a plurality of layers inside a multilayer substrate,
the first filter and the second filter are mounted on the multilayer substrate, and
the wiring line is formed in the multilayer substrate.

4. The multiplexer according to claim 1, wherein surface acoustic waves of the at least one surface acoustic wave resonator are leaky waves that propagate along a piezoelectric substrate composed of lithium tantalate ($LiTaO_3$).

5. The multiplexer according to claim 1, wherein surface acoustic waves of the at least one surface acoustic wave resonator are Love waves that propagate along a piezoelectric substrate composed of lithium niobate ($LiNbO_3$).

6. The multiplexer according to claim 1, further comprising:
a third input/output terminal; and
a third filter of the plurality of filters, the third filter having a third pass band and being formed from at least one surface acoustic wave resonator arranged between the common terminal and the third input/output terminal, wherein:
the third pass band has a lower frequency than the second pass band,
surface acoustic waves of the at least one surface acoustic wave resonator of the third filter are Rayleigh waves that propagate along a piezoelectric substrate composed of lithium niobate ($LiNbO_3$), and
there is no capacitor serially arranged on a path between the common terminal and the third filter.

7. The multiplexer according to claim 1, further comprising:
a switch configured to switch an electrical connection of a signal path between the common terminal and one of the plurality of filters.

8. The multiplexer according to claim 1, further comprising:
an inductor that is connected between the common terminal and a ground terminal.

9. A high-frequency front end circuit comprising:
the multiplexer according to claim 1; and
an amplification circuit that is connected to the multiplexer.

10. A communication device comprising:
a radio frequency (RF) signal processing circuit configured to process a high-frequency signal transmitted or received by an antenna; and
the high-frequency front end circuit according to claim 9 configured to transmit the high-frequency signal between the antenna and the RF signal processing circuit.

* * * * *